United States Patent
Baek et al.

(10) Patent No.: US 9,129,830 B2
(45) Date of Patent: Sep. 8, 2015

(54) THREE-DIMENSIONAL SEMICONDUCTOR MEMORY DEVICES HAVING DOUBLE CROSS POINT ARRAY AND METHODS OF FABRICATING THE SAME

(75) Inventors: Ingyu Baek, Seoul (KR); Sunjung Kim, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 203 days.

(21) Appl. No.: 13/494,236

(22) Filed: Jun. 12, 2012

(65) Prior Publication Data

US 2012/0313072 A1    Dec. 13, 2012

(30) Foreign Application Priority Data

Jun. 13, 2011    (KR) ........................ 10-2011-0056994

(51) Int. Cl.
   *H01L 27/06*  (2006.01)
   *H01L 27/10*  (2006.01)
   *H01L 27/22*  (2006.01)
   *H01L 27/24*  (2006.01)
   *G11C 13/00*  (2006.01)
   *H01L 45/00*  (2006.01)

(52) U.S. Cl.
   CPC .......... *H01L 27/0688* (2013.01); *H01L 27/101* (2013.01); *H01L 27/224* (2013.01); *H01L 27/2409* (2013.01); *H01L 27/2463* (2013.01); *H01L 27/2472* (2013.01); *H01L 27/2481* (2013.01); *G11C 13/0004* (2013.01); *G11C 13/0007* (2013.01); *G11C 2213/71* (2013.01); *H01L 45/04* (2013.01); *H01L 45/06* (2013.01); *H01L 45/085* (2013.01); *H01L 45/1233* (2013.01); *H01L 45/142* (2013.01); *H01L 45/144* (2013.01); *H01L 45/145* (2013.01); *H01L 45/146* (2013.01); *H01L 45/147* (2013.01); *H01L 45/1683* (2013.01)

(58) Field of Classification Search
   CPC ............ H01L 27/2472; H01L 27/2481; H01L 45/1253; H01L 45/122
   USPC ........................................................ 257/4, 5
   See application file for complete search history.

(56) References Cited

U.S. PATENT DOCUMENTS

| | | | |
|---|---|---|---|
| 6,185,122 B1 | 2/2001 | Johnson et al. | |
| 7,391,045 B2 | 6/2008 | Lowrey | |
| 7,679,075 B2 | 3/2010 | Chao | |
| 2008/0029754 A1* | 2/2008 | Min et al. | 257/4 |
| 2009/0065758 A1* | 3/2009 | Chao | 257/4 |
| 2009/0168491 A1* | 7/2009 | Schricker et al. | 365/148 |
| 2009/0256133 A1* | 10/2009 | Kau et al. | 257/5 |

FOREIGN PATENT DOCUMENTS

JP        2009-283514        3/2009

* cited by examiner

Primary Examiner — Yu-Hsi D Sun
(74) Attorney, Agent, or Firm — Ellsworth IP Group PLLC

(57) ABSTRACT

Three-dimensional semiconductor memory devices and methods of fabricating the same. The device may include first, second and third conductive lines disposed at different vertical levels to define two intersections, and two memory cells disposed at the two intersections, respectively. The first and second conductive lines may extend parallel to each other, and the third conductive line may extend to cross the first and second conductive lines. The first and second conductive lines can be alternatingly arranged along the length of third conductive line in vertical sectional view, and the third conductive line may be spaced vertically apart from the first and second conductive lines.

21 Claims, 39 Drawing Sheets

THREE-DIMENSIONAL SEMICONDUCTOR MEMORY DEVICES HAVING DOUBLE CROSS POINT ARRAY AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0056994, filed on Jun. 13, 2011, in the Korean Intellectual Property Office, the entire contents of which are hereby incorporated by reference.

BACKGROUND OF THE INVENTION

1. Field of the Invention

Embodiments of the inventive concepts relate generally to a semiconductor device. More particularly, embodiments of the inventive concepts relate to three-dimensional semiconductor memory devices having double cross point array and methods of fabricating the same.

2. Description of the Related Art

To meet the demands of high-capacity and high-density semiconductor memory devices, there has been proposed a memory device having a three-dimensional cross-point array structure as described in U.S. Pat. No. 6,185,122 by Johnson et al. The memory device proposed by Johnson includes two or more memory layers of cross-point array, but the memory layers located at different levels are configured to share a bit line therebetween. Furthermore, three conductive lines are required to form two memory layers at different levels, but at least two thereof should be formed to be orthogonal to each other. According to this structure, processes for making memory cells or selection devices should be repeated for every memory layer. Moreover, in the case that three or more memory layers are stacked vertically, the memory device may suffer from an increase in disturbance between the memory layers and a decrease in operation margin.

SUMMARY OF THE INVENTION

Embodiments of the inventive concepts provide a method of fabricating a semiconductor memory device in a simplified manner and a semiconductor memory device fabricated thereby.

Other embodiments of the inventive concepts provide a semiconductor memory device with an increased integration density and a method of fabricating the same.

Still other embodiments of the inventive concepts provide a semiconductor memory device with an improved electric property and a method of fabricating the same.

Additional features and utilities of the present general inventive concept will be set forth in part in the description which follows and, in part, will be obvious from the description, or may be learned by practice of the general inventive concept.

According to example embodiments of the inventive concepts, two memory layers at different levels are fabricated using substantially the same process. This enables to simplify the fabrication process of the memory device and increase an integration density of the memory device. In some embodiments, two parallel conductive lines are arranged at different levels to cross one conductive line, thereby defining two intersections where two memory cells are disposed. According to some aspects of the inventive concepts, it is possible to realize a twice increased memory cell density.

Exemplary embodiments of the general inventive concept provide a semiconductor memory device, including: first conductive lines extending along a first direction; second conductive lines extending along the first direction in parallel with the first conductive lines and disposed vertically higher than the first conductive lines; third conductive lines extending along a second direction to cross the first and second conductive lines to form intersections therewith and disposed vertically higher than the second conductive lines; and first and second memory cells provided at the intersections of the first conductive lines and third conductive lines and at the intersections of the second conductive lines and third conductive lines, respectively.

Exemplary embodiments of the general inventive concept also provide a semiconductor memory cell array, including a plurality of first conductive lines extending in a first direction on a semiconductor substrate; a plurality of second conductive lines disposed vertically above the first conductive lines and extending in the first direction; a plurality of third conductive lines disposed vertically above the second conductive lines and forming a plurality of first and second intersections respectively crossing the first and second conductive lines; and a plurality of memory cells disposed at the plurality of the first and second intersections.

Exemplary embodiments of the general inventive concept also provide a method of fabricating a semiconductor memory device, the method including: forming a plurality of first conductive lines on a substrate at a first vertical level extending in a first direction and spaced apart in a second direction perpendicular to the first direction; forming a plurality of second conductive lines on a substrate at a second vertical level extending in the first direction and spaced apart in the second direction such that respective ones of the first conductive lines and the second conductive lines are arranged in an alternating manner with respect to each other in the second direction; forming a plurality of first and second lower electrodes extending along the first and second conductive lines, respectively; forming a data storage layer and an upper electrode extending along the second direction to form intersections with the first and second lower electrodes; and forming a plurality of third conductive lines extending in the second direction at a third vertical level higher than the second vertical level to intersect with the first and second conductive lines to form memory cells at the intersections thereof.

Exemplary embodiments of the general inventive concept also provide a semiconductor memory device, including: first conductive lines extending along a first direction; second conductive lines extending along a second direction to intersect the first conductive lines and disposed vertically higher than the first conductive lines; lower electrodes disposed along the first conductive lines facing the second conductive lines; upper electrodes disposed along the second conductive lines facing the first conductive lines; and data storage layers disposed between the upper and lower electrodes at the intersection points to form memory cells.

Exemplary embodiments of the general inventive concept also provide a method of fabricating a semiconductor memory device, the method comprising: forming first conductive lines on a substrate spaced apart by a predetermined distance; forming a first interlayer dielectric layer over the first conductive lines; forming second conductive lines on the first interlayer dielectric layer shifted vertically from the first conductive lines; forming sidewall spacers to cover sidewalls of the second conductive lines; forming a second interlayer dielectric layer over the second conductive lines and spacers; forming trenches to expose portions of the first and second conductive lines adjacent to each other; depositing a conductive layer on the second interlayer dielectric layer and in the trenches; etching the conductive layer to form first and second lower electrodes extending along upper portions of the first and second conductive lines respectively; forming insulating layers within the trenches to be the same height as the second interlayer dielectric layers; forming sequentially a data storing layer, an upper electrode layer and a third conductive layer above the insulating layers and the second interlayer dielectric layer; and patterning the third conductive layer to form third conductive lines crossing the first and second conductive lines.

Exemplary embodiments of the general inventive concept also provide a semiconductor memory device, including: first conductive lines extending in a first direction;

second conductive lines extending in the first direction and vertically shifted from the first conductive lines to overlap a portion of the first conductive lines; first lower electrodes extending along a center of the first conductive lines; second lower electrodes extending along a center of the second conductive lines such that a distance between the first lower electrodes and the second lower electrodes is substantially equivalent to a width of the first and second conductive lines; third conductive lines extending in a second direction to cross the first and second lower electrodes; and first and second memory cells disposed between the third conductive lines and the first lower electrodes and between the third conductive lines and the second lower electrodes, respectively.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

Figure 1A:
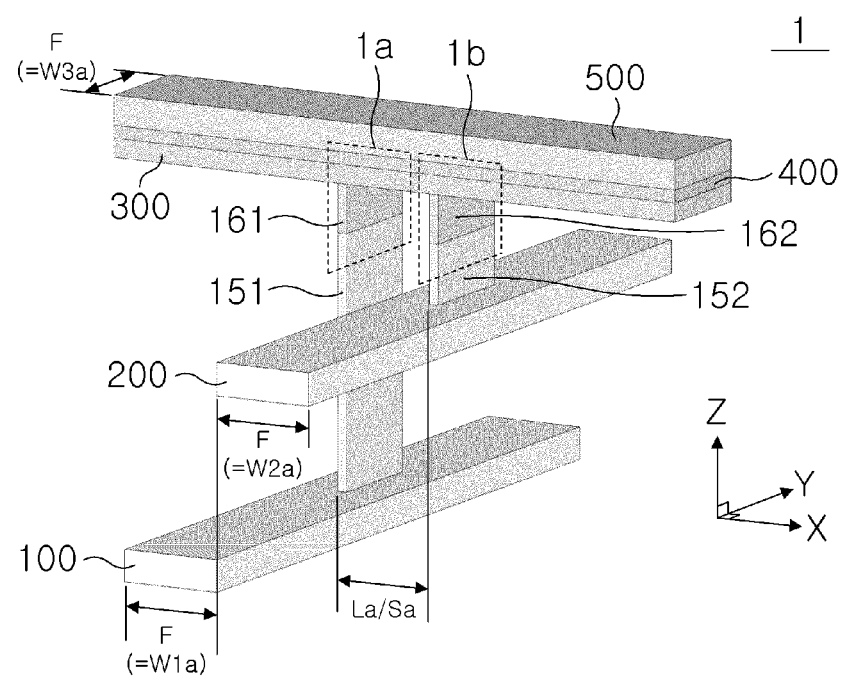
FIG. 1A is a perspective view of a memory cell structure according to exemplary embodiments of the general inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE PREFERRED EMBODIMENTS

Various exemplary embodiments of the present inventive concept will now be described more fully with reference to the accompanying drawings, in which the exemplary embodiments are shown. Exemplary embodiments of the inventive concepts may, however, be embodied in many different forms and should not be construed as being limited to the embodiments set forth herein; rather, these embodiments are provided so that this disclosure will be thorough and complete, and will fully convey the concept of the exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the present inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Exemplary Embodiment 1 of Three-Dimensional Double Cross-Point Array]

FIG. 1A is a perspective view of a memory cell structure according to exemplary embodiments of the present inventive concept.

Referring to FIG. 1A, a memory cell structure 1 may be a three-dimensional (3D) double cross-point array structure with three conductive lines 100, 200 and 500 and two memory cells 1a and 1b.

The first memory cell 1a may be provided at an intersection of the first conductive line 100 and the third conductive line 500. The first memory cell 1a may include a first lower electrode 151, a data storing layer 300 and an upper electrode 400 serially connected with each other. In some embodiments, the first memory cell 1a may further include a first selection device 161 interposed between the first lower electrode 151 and the first data storing layer 300. The first conductive line 100, the third conductive line 500 and the first memory cell 1a may constitute a 3-dimensional structure.

The first lower electrode 151 may be configured to apply a specific voltage or electric current to the data storing layer 300. Resistance of the data storing layer 300 may vary depending on a voltage or electric current applied to the data storing layer 300 and therefore, may be used as non-volatile information. For instance, the data storing layer 300 may have a higher or lower resistance depending on a voltage or electric current applied thereto, and the two resistance levels may constitute one bit data stored in the first memory cell 1a. In some embodiments, the data storing layer 300 may have three or more stable resistance levels, which may allow storing a multi-bit data in the first memory cell 1a.

The data storing layer 300 and the upper electrode 400 may be formed to exhibit an ohmic contact property at an interface therebetween. The first lower electrode 151 and data storing layer 300 may be formed to exhibit a non-linear junction resistance property. An electric current passing through the first memory cell 1a may be increased or decreased with a decrease or increase in a voltage applied to the first memory cell 1a. For instance, as will be described below, the data storing layer 300 may include a transition metal oxide layer or a Perovskite oxide layer having semiconductor characteristics. In this case, the first lower electrode 151 and the data storing layer 300 may form a metal-semiconductor junction such as a Schottky contact having a rectifying property. The first lower electrode 151 and the data storing layer 300 may be vertically stacked. As a result, the electric current may flow vertically at the first memory cell 1a. A dominant flow of the electric current may be upward (from the first conductive line 100 to the third conductive line 500) or downward (from the third conductive line 500 to the first conductive line 100), depending on characteristics of the junction formed by the first lower electrode 151 and the data storing layer 300.

The first selection device 161 may be configured to exhibit asymmetric I-V or rectifying characteristics. Due to the presence of the first selection device 161, the electric current passing through the first memory cell 1a may be controlled to have a unidirectional property. Even in the case that the first lower electrode 151 and the data storing layer 300 may not have the rectifying property, the first selection device 161 may be used to realize directional asymmetry in the electric current passing through the first memory cell 1a.

In other embodiments, the first selection device 161 may include a non-linear resistor exhibiting a resistance property that varies depending on an applied voltage. For example, in the case that resistance of the resistor is inversely proportional to an applied voltage, a cell (e.g., a selected cell) under a high voltage difference may be in a low resistance state allowing an electric current passing through the selected cell, while other cells (e.g., non-selected cells) under a low voltage difference may be in a high resistance state preventing electric currents from passing through the non-selected cells.

The second conductive line 200 may be vertically disposed on the first conductive line 100, while in plan view, the first and second conductive lines 100 and 200 may be shifted from each other in the X-direction and not fully overlap with each other. The second memory cell 1b may be provided at an intersection of the second conductive line 200 and the third conductive line 500. The second memory cell 1b may include a second lower electrode 152, the data storing layer 300 and the upper electrode 400 that are sequentially connected in series. The second memory cell 1b may include a second selection device 162 provided between the second lower electrode 152 and the data storing layer 300. The second conductive line 200, the third conductive line 500 and the second memory cell 1b may be disposed to form a three-dimensional structure.

The second memory cell 1b may be configured to have the same or similar features as the first memory cell 1a. For instance, an electric current passing through the second memory cell 1b may be unidirectional or dominant in one direction, depending on junction characteristics between the second lower electrode 152 and the data storing layer 300 and/or a rectifying or resistance property of the second selection device 162.

Each of the first and second conductive lines 100 and 200 may be used as an input line or a word line, and the third conductive line 500 may be used as an output line or a bit line. In other embodiments, each of the first and second conductive lines 100 and 200 may be used as the output line or the bit line, and the third conductive line 500 may be used as the input line or the word line. In the first memory cell 1a, the first lower electrode 151, the first selection device 161, the data storing layer 300 and the upper electrode 400 may be vertically stacked in a sequential order or in a reverse order. In the second memory cell 1b, the second lower electrode 152, the second selection device 162, the data storing layer 300 and the upper electrode 400 may be vertically stacked in a sequential order or in a reverse order.

Figure 2A:
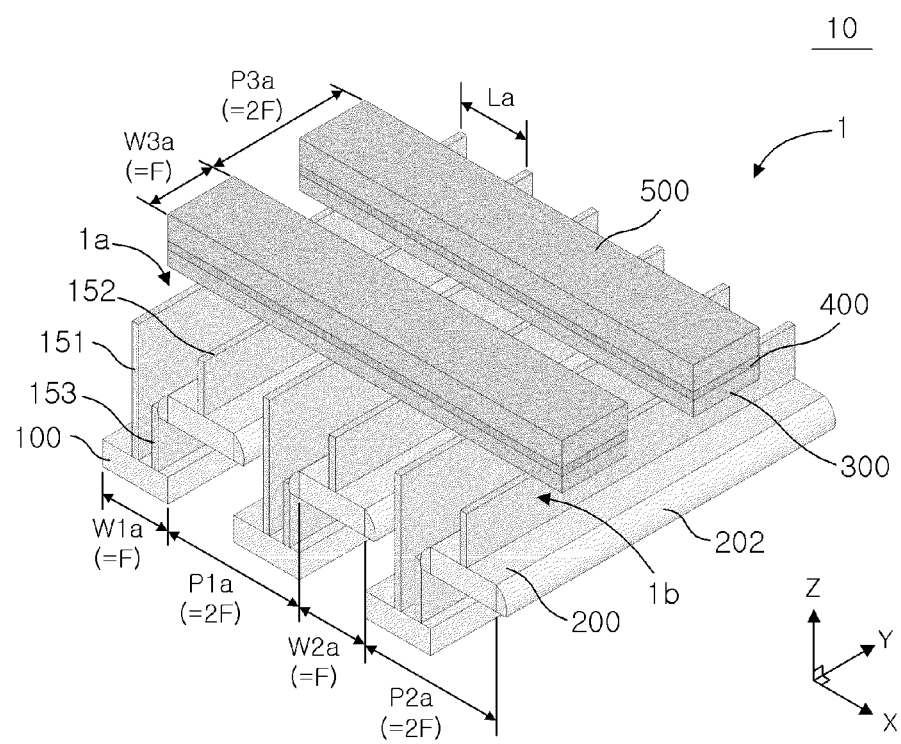
FIG. 2A is a perspective view of a semiconductor memory device according to exemplary embodiments of the inventive concept.
Figure 2B:
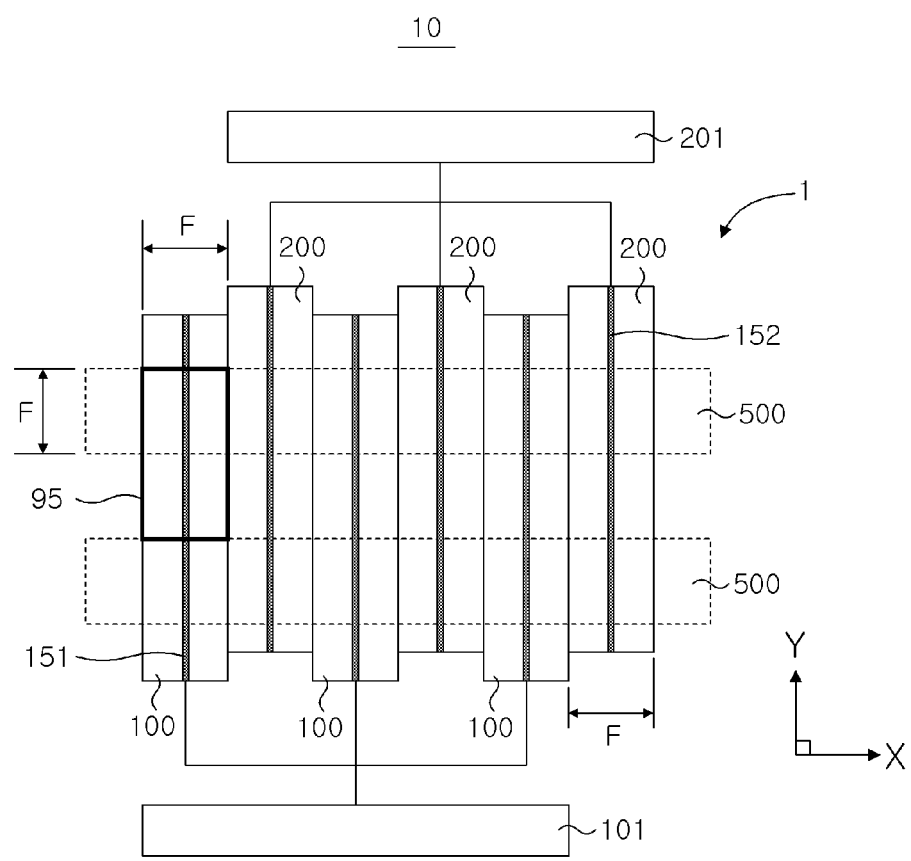
FIG. 2B is a plan view of FIG. 2A.

The first and second memory cells 1a and 1b may be connected to driving circuits (101 and 201 of FIG. 2B). The driving circuits 101 and 201 may be configured to independently apply a specific voltage or electric current to the first and second memory cells 1a and 1b, respectively. This enables to independently access one of the first and second memory cells 1a and 1b to perform a read or write operation, regardless of a state of the other.

The first conductive line 100 may include a line-shaped conductive element that is elongated along a direction, for instance, Y-direction. The second conductive line 200 may include a line-shaped conductive element that is elongated parallel to the first conductive line 100. The third conductive line 500 may include a line-shaped conductive element that is elongated along a direction (for instance, X-direction) crossing the first conductive line 100. In some embodiments, the first and second conductive lines 100 and 200 may be parallel to each other, and the third conductive line 500 may perpendicularly cross the first and second conductive lines 100 and 200. As a result, the first and second conductive lines 100 and 200 and the third conductive line 500 may define two intersections that are spaced apart from each other in the X-direction and provided with the first and second memory cells 1a and 1b.

The first, second and third conductive lines 100, 200 and 500 may be disposed at different vertical levels (i.e., along Z-direction). In some embodiments, the second conductive line 200 may be disposed at a higher vertical level than the first conductive line 100, and the third conductive line 500 may be disposed at a higher vertical level than the second conductive line 200. The first conductive line 100 may be formed to have a width W1a substantially equivalent to a minimum feature size (hereinafter, refer to as "F"), and the second and third conductive lines 200 and 500 may also be formed to have widths W2a and W3a, respectively, which may be substantially the same as the minimum feature size F. The "minimum feature size" (F) refers to the smallest size for an independent unit feature dimension that may be formed using a photolithographic process.

In some embodiments, from a plan view, the first conductive line 100 and the second conductive line 200 may not be spaced apart from each other in the X-direction. For instance, the first and second conductive lines 100 and 200 may be disposed in such a way that, from a plan view, there is no horizontal space between the first and second conductive lines 100 and 200 in the X-direction, while they may be vertically spaced apart from each other. This enables to maximally reduce the horizontal space between the first and second conductive lines 100 and 200 and increase an integration density of the semiconductor device at least in the horizontal X-direction. However, example embodiments of the inventive concepts may not be limited thereto; for instance, the first conductive line 100 and the second conductive line 200 may be spaced apart from each other in the X-direction.

The first lower electrode 151 may be a conductive element disposed on a top surface of the first conductive line 100. From a plan view, the first lower electrode 151 may be shaped like a line elongated along the running direction of the first conductive line 100 or like an island confined within the intersection of the first and third conductive lines 100 and 500. Similarly, the second lower electrode 152 may be a conductive element disposed on a top surface of the second conductive line 200. From a plan view, the second lower electrode 152 may be shaped like a line elongated along the running direction of the second conductive line 200 or like an island confined within the intersection of the second and third conductive lines 200 and 500. Each of the first and second lower electrodes 151 and 152 may have a width smaller than the minimum feature size F. The second lower electrode 152 may have a vertical length smaller than that of the first lower electrode 151. A pitch La between the first lower electrode 151 and the second lower electrode 152 may be substantially equivalent to the minimum feature size F, where the pitch La may be defined as a sum of a horizontal thickness of the first lower electrode 151 (or the second lower electrode 152) and a distance between the first and second lower electrodes 151 and 152. But example embodiments of the inventive concepts may not be limited thereto. For instance, in other embodiments, the pitch La may be smaller or greater than the minimum feature size F.

The first selection device 161 may be disposed on the first conductive line 100 and be shaped like an island confined within the intersection between the first and third conductive lines 100 and 500. The first selection device 161 may include a diode exhibiting a rectifying property. In some embodiments, the diode of the first selection device 161 may be formed of silicon or oxide. For instance, the first selection device 161 may include a silicon diode formed by joining p-type and n-type silicon patterns in contact with each other, or an oxide diode formed by joining p-NiOx and n-TiOx patterns or by joining p-CuOx and n-TiOx patterns. In other embodiments, the first selection device 161 may include at least one of oxide materials, for instance, ZnOx, MgOx, and AlOx, which may have high resistance enough to prevent an electric current from flowing through it at a specific voltage or less and low resistance allowing a flow of electric current at the specific voltage or more.

The second selection device 162 may be disposed on the second conductive line 200 and be shaped like an island confined within the intersection between the second and third conductive lines 200 and 500. In some embodiments, the second selection device 162 may include the same material as the first selection device 161. The first and second selection devices 161 and 162 may have widths smaller than the minimum feature size F. The second selection device 162 may have a vertical length equivalent or similar to that of the first selection device 161. A pitch Sa between the first selection device 161 and the second selection device 162 may be substantially equivalent to or smaller or greater than the minimum feature size F. Here, the pitch Sa may be defined as a sum of a horizontal thickness of the first selection device 161 (or the second selection device 162) and a distance between the first and second selection devices 161 and 162, like as the pitch La.

The data storing layer 300 may be shaped like a line elongated along the running direction of the third conductive line 500 or the X-direction and be formed to have a width equivalent or similar to the minimum feature size F. The data storing layer 300 may be connected, in common, to the first and second lower electrodes 151 and 152 or to the first and second selection devices 161 and 162. The data storing layer 300 may include a material having at least two stable resistance states, which may reversibly vary depending on a voltage or electric current applied thereto and be maintained as it is until an external signal is applied thereto.

For instance, the data storing layer 300 may include a material in which a current path can be created by applying a high voltage thereto. The current path created in the data storing layer 300 may lead to a reduction in resistance of the data storing layer 300. In some embodiments, the data storing layer 300 may include at least one of, for instance, metal oxide (e.g., TiOx, HfOx, TaOx, NiOx, ZrOx, and WOx), metal nitride (e.g., BNx and AlNx), oxide having Perovskite structure (e.g., PrCaMnO and doped-SrTiO), and solid electrolyte (e.g., GeTe and GeS) containing metal ion (e.g., Cu and Ag) with high diffusivity. Hereinafter, this type of memory cell will be described as a resistive random access memory (RRAM) cell. The data storing layer 300 may be in contact with the first and second lower electrodes 151 and 152 formed of a metallic material. In this case, the data storing layer 300 may exhibit a rectifying behavior. If a set voltage is applied to the data storing layer 300 in a high resistance state or in an off-state, the data storing layer 300 may be switched to a low resistance state or to an on-state. This is referred to as a set operation. If a reset voltage is applied to the data storing layer 300 in the low resistance state or in the on-state, the data storing layer 300 may be switched to the high resistance state or to the off-state, while the data storing layer 300 in the on state may have a low resistance until a reset voltage is applied thereto. This is referred to as a reset operation. A data stored in the data storing layer 300 can be read out by applying a read voltage smaller than the reset or set voltage to the data storing layer 300.

In other embodiments, the data storing layer 300 may include a phase changeable material, which may be switched from a high resistance (amorphous) state to a low resistance (crystalline) state and back again, depending on temperature and a heating time. The temperature and heating time of the data storing layer 300 may be controlled by adjusting electric current passing through the data storing layer 300. Hereinafter, this type of memory cell will be described as a phase changeable random access memory (PRAM) cell. The phase changeable material may include at least one chalcogenide compound, whose crystallographic structure can be reversibly switched between a high-resistance amorphous state and a low-resistance crystalline state, using the Joule-heating effect. For instance, if the data storing layer 300 is heated to a temperature higher than a melting point thereof in a short time by a reset current and quenched rapidly, the data storing layer 300 may become an amorphous or reset state with high resistance. Also, if the data storing layer 300 in the high resistance state is heated to a temperature between a crystallization temperature and a melting point thereof by a set current and slowly cooled, the data storing layer 300 may become a crystalline or set state with low resistance. Detecting an electric current passing through the data storing layer 300 may enable to read out information stored in the first memory cell 1a and/or the second memory cell 1b.

In still other embodiments, the data storing layer 300 may include at least two ferromagnetic layers. In this case, resistance of the data storing layer 300 may be determined depending on whether magnetizations of the ferromagnetic layers are parallel or antiparallel. For instance, the data storing layer 300 may exhibit low resistance for parallel magnetization configuration and exhibit high resistance for antiparallel magnetization configuration. The data storing layer 300 may be configured in a form of a GMR structure, in which a non-magnetic conductive layer is interposed between the ferromagnetic layers, or a MTJ structure, in which a non-magnetic insulating layer is interposed between the ferromagnetic layers. In some embodiments, in the data storing layer 300, the ferromagnetic layer may include at least one of CoFe, NiFe, NiFeCo and CoFeB, and the non-magnetic conductive layer may include at least one of Cr or Cu, and the non-magnetic insulating layer may include at least one of MgOx and AlOx. When the first or second memory cell 1a or 1b is configured to have this data storing layer 300, it may be called an "MRAM cell."

The upper electrode 400 may be shaped like a line elongated along the running direction of the third conductive line 500 or the X-direction and be formed to have the same width as the minimum feature size F. The upper electrode 400 may include a metal layer being non-reactive with the data storing layer 300. The upper electrode 400 may include at least one of noble metals (such as Pt, Ru, and Ir), TiN, TaN, WN, W and Al.

Figure 1B:
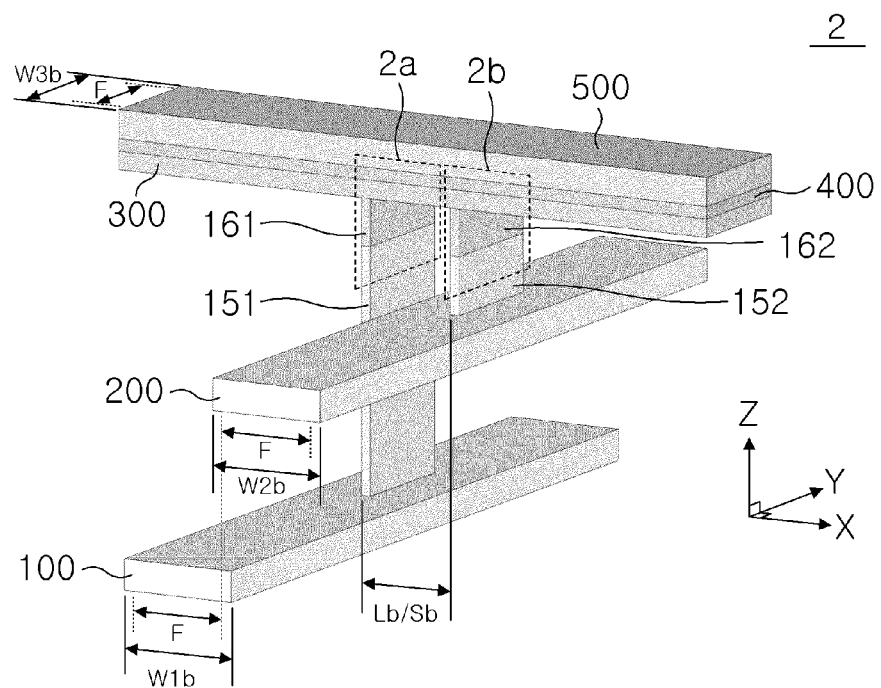
FIGS. 1B and 1C are perspective views of memory cell structures according to embodiments modified from the exemplary embodiments described with reference to FIG. 1A.

FIG. 1B is a perspective view of a memory cell structure according to embodiments modified from the embodiments described with reference to FIG. 1A. For concise description, overlapping description of elements previously described with reference to FIG. 1A may be omitted.

Referring to FIG. 1B, a memory cell structure 2 may be a 3D double cross-point array structure having the first conductive line 100 and the second conductive line 200 partially overlapping each other in a plan view and spaced apart from each other in a vertical view. For instance, a width W1b of the first conductive line 100 and a width W2b of the second conductive line 200 may be increased, compared with the width W1a of the first conductive line 100 and the width W2a of the second conductive line 200 of FIG. 1A, to be greater than the minimum feature size F. In this case, as shown in FIG. 1B, a right-side portion of the first conductive line 100 may be partially overlapped with a left-side portion of the second conductive line 200 in plan view.

According to the present embodiments of FIG. 1B, as compared with the embodiments of FIG. 1A, the first and second conductive lines 100 and 200 may have increased sectional areas and reduced resistances. The third conductive line 500 may have a width W3b greater than the minimum feature size F, and therefore, resistance of the third conductive line 500 may be reduced as compared with the embodiments of FIG. 1A. In other embodiments, the width W3b of the third conductive line 500 may be the substantially same as the minimum feature size F. The first and second lower electrodes 151 and 152 may be alternatingly arranged with a pitch Lb, which may be substantially equivalent to or smaller or greater than the minimum feature size F. The first and second selection devices 161 and 162 may be alternatingly arranged with a pitch Sb, which may be substantially equivalent to or smaller or greater than the minimum feature size F. In the present embodiments, the pitches may be configured to satisfy the relationship of La=Lb=Sa=Sb.

Figure 1C:
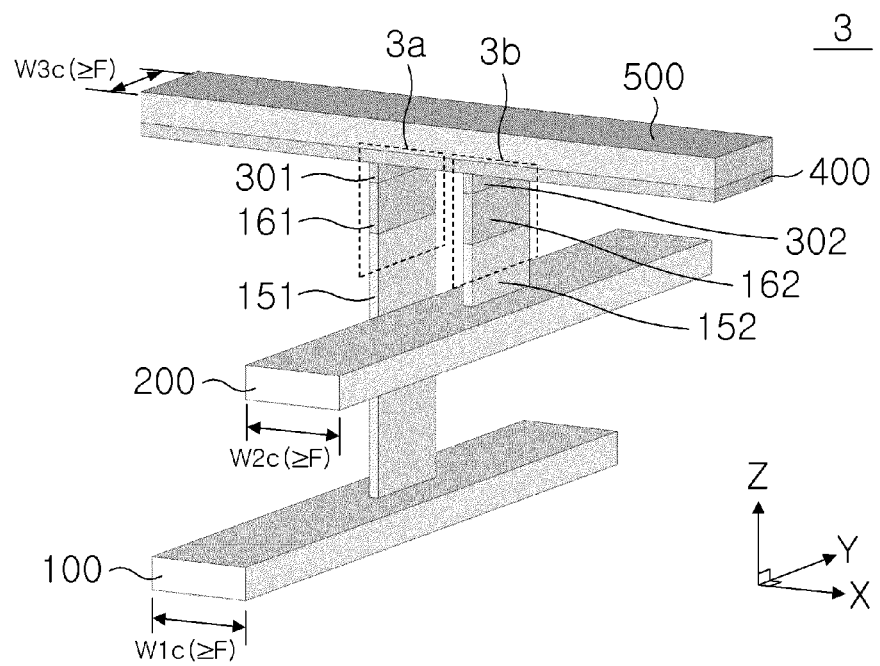

FIG. 1C is a perspective view of a memory cell structure according to embodiments modified from the embodiments described with reference to FIG. 1A. For concise description, overlapping description of elements previously described with reference to FIG. 1A may be omitted.

Referring to FIG. 1C, a memory cell structure 3 may include a first memory cell 3a and a second memory cell 3b provided at intersections of the first and second conductive lines 100 and 200 and the third conductive line 500.

There may be data storing layers 301 and 302 arranged along the running direction of the third conductive line 500 to be spaced apart from each in the X-direction. For instance, the data storing layers 301 and 302 may include a first data storing layer 301 provided at an intersection of the first conductive line 100 and the third conductive line 500 and a second data storing layer 302 provided at an intersection of the second conductive line 200 and the third conductive line 500. The first data storing layer 301 may be shaped like a line elongated along the running direction of the first conductive line 100 or like an island similar to the first selection device 161. The second data storing layer 302 may be shaped like a line elongated along the running direction of the second conductive line 200 or like an island similar to the second selection device 162.

A width W1c of the first conductive line 100 and a width W2c of the second conductive line 200 may be substantially equivalent to or greater than the minimum feature size F. For instance, the first and second conductive lines 100 and 200 may have the widths W1c and W2c, respectively, which may be substantially equivalent to the minimum feature size F, and be arranged vertically spaced apart from each other and horizontally next to or spaced apart from each other, like as the embodiments described with reference to FIG. 1A. In other embodiments, similar to the embodiments of FIG. 1B, the first and second conductive lines 100 and 200 may have the widths W1c and W2c, respectively, greater than the minimum feature size F, while the first and second conductive lines 100 and 200 may be partially overlapped with each other in plan view and spaced apart from each other in vertical view. The width W3c of the third conductive line 500 may be substantially equivalent to or greater than the minimum feature size F.

Figure 2C:
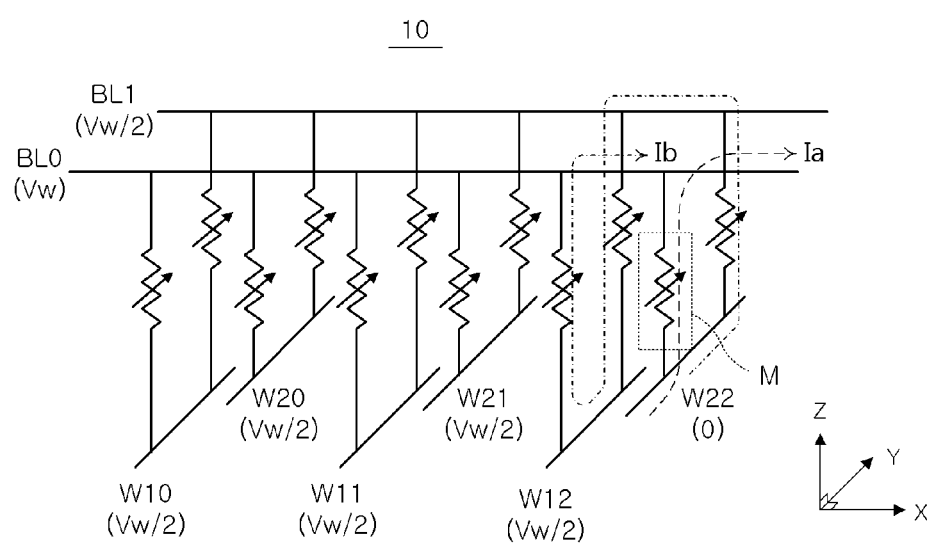
FIG. 2C is an equivalent circuit diagram of FIG. 2A.
Figure 2D:
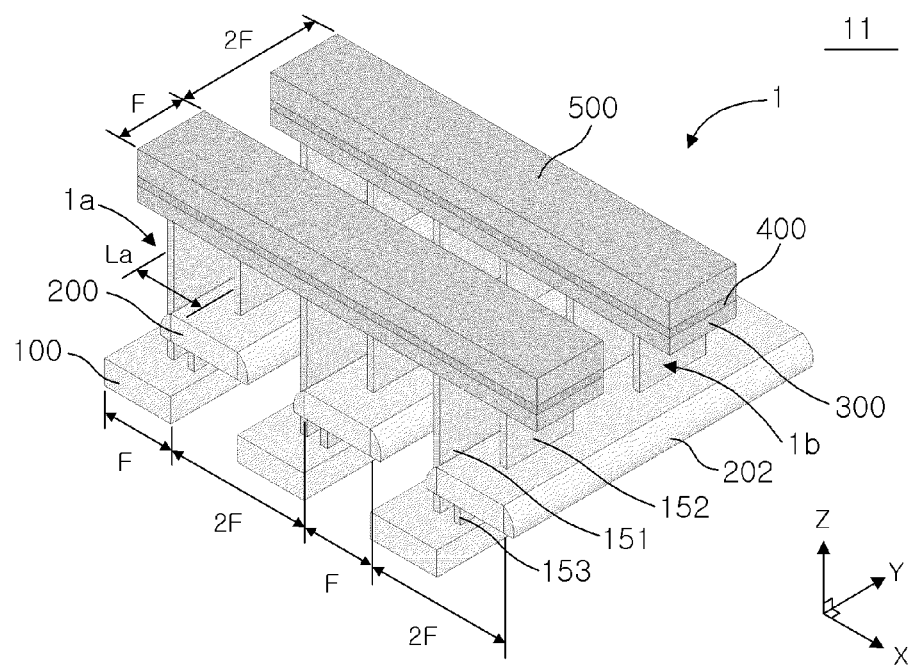
FIG. 2D is a perspective view of a semiconductor memory device according to exemplary embodiments modified from the exemplary embodiments described with reference to FIG. 2A.

FIG. 2A is a perspective view of a semiconductor memory device according to example embodiments of the inventive concepts. FIG. 2B is a plan view of FIG. 2A, and FIG. 2C is an equivalent circuit diagram of FIG. 2A. FIG. 2D is a perspective view of a semiconductor memory device according to embodiments modified from the embodiments described with reference to FIG. 2A.

Referring to FIG. 2A, a semiconductor memory device 10 may include a 3D double cross-point array configured to have the memory cell structure 1 shown in FIG. 1A. For instance, the semiconductor memory device 10 may include a plurality of the first conductive lines 100, a plurality of the second conductive lines 200, and a plurality of the third conductive lines 500. The first and second conductive lines 100 and 200 may extend along the Y-direction to be parallel to each other, and the third conductive lines 500 may extend along the X-direction to cross the first and second conductive lines 100 and 200. As a result, the semiconductor memory device 10 may have a plurality of intersections defined by the first and second conductive lines 100 and 200 and the third conductive lines 500. The first conductive lines 100 may be disposed on a first plane to be coplanar with each other, the second conductive lines 200 may be disposed on a second plane positioned at a higher level than the first plane to be coplanar with each other, and the third conductive lines 500 may be disposed on a third plane positioned at a higher level than the second plane to be coplanar with each other.

Figure 8A:
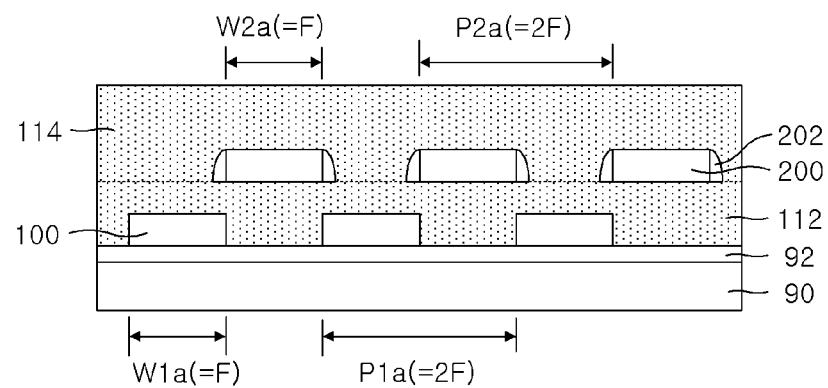
FIGS. 8A through 8E are sectional views illustrating methods of fabricating a semiconductor memory device according to exemplary embodiments of the inventive concept.

The first memory cells 1a may be provided at intersections of the first conductive lines 100 and the third conductive lines 500, and the second memory cells 1b may be provided at intersections of the second conductive lines 200 and the third conductive lines 500. Although not depicted in FIG. 2A, the first conductive lines 100 may be disposed on a semiconductor substrate 90 and an insulating layer 92 may be interposed between the first conductive lines 100 and the semiconductor substrate 90, as shown in FIG. 8A.

The first conductive lines 100 may be formed to have the width W1a substantially equivalent to the minimum feature size F. The first conductive lines 100 may be arranged in the X-direction with a pitch P1a of 2 F, and a distance of the first conductive lines 100 adjacent to each other may be equivalent to the minimum feature size F. The second conductive lines 200 may be formed to have the width W2a substantially equivalent to the minimum feature size F and be arranged in the X-direction with a pitch P2a of 2 F. A distance of the second conductive lines 200 adjacent to each other may be equivalent to the minimum feature size F. The second conductive lines 200 may be disposed vertically at a higher level than the first conductive lines 100 and horizontally between the first conductive lines 100. This enables to arrange the first and second conductive lines 100 and 200 in an alternating manner without an X-directional space existing between the conductive lines 100 and 200. The third conductive lines 500 may be formed to have a width W3a substantially equivalent to the minimum feature size F. The third conductive lines 500 may be arranged in the Y-direction with a pitch P3a of 2 F, and a distance of the third conductive lines 500 adjacent to each other may be equivalent to the minimum feature size F. In some embodiments, the data storing layers 300 and the upper electrodes 400 may be configured to have the same shape and arrangement as the third conductive lines 500.

As shown in FIG. 2B, the first conductive lines 100 may be electrically connected to a first driving circuit 101, and the second conductive lines 200 may be electrically connected to a second driving circuit 201. The first and second driving circuits 101 and 201 may be disposed spaced apart from each other; for instance, the first and second driving circuits 101 and 201 may be positioned to face each other at both sides of the memory cell array 1. In some embodiments, the first driving circuit 101 and the second driving circuit 201 may be integrated on the semiconductor substrate.

In the case that the second conductive lines 200 are positioned at the same level as the first conductive lines 100, the first and second conductive lines 100 and 200 may need to be horizontally spaced apart from each other by the minimum feature size F. In this case, an occupying area of a unit memory cell may be $4F^2$. By contrast, according to the present embodiments, there may be no space between the first and second conductive lines 100 and 200, and thus, the occupying area 95 of a unit memory cell may be 2 $F^2$ as shown in FIG. 2B. In other words, the first and second conductive lines 100 and 200 may be alternatingly disposed at two vertical levels, and thus, the first and second conductive lines 100 and 200 may be formed in a reduced area, for instance, reduced by half with respect to the case that the first and second conductive lines 100 and 200 are disposed at the same level. This enables an increase a memory cell density.

Figure 8B:
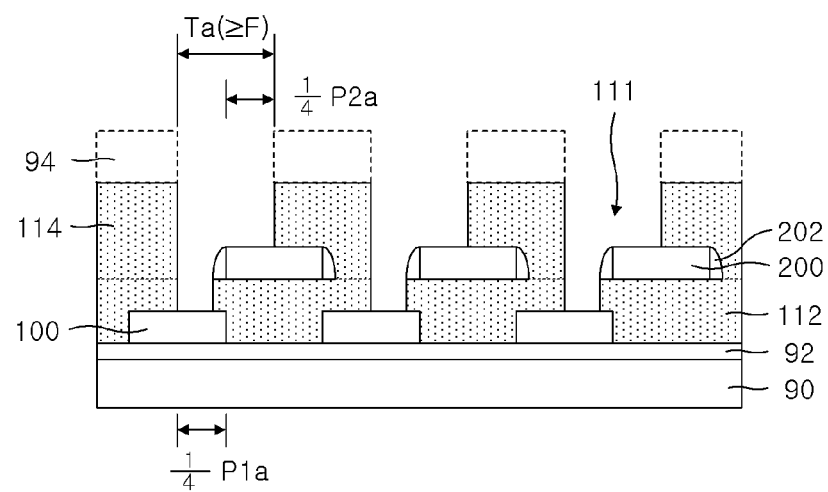
Figure 8C:
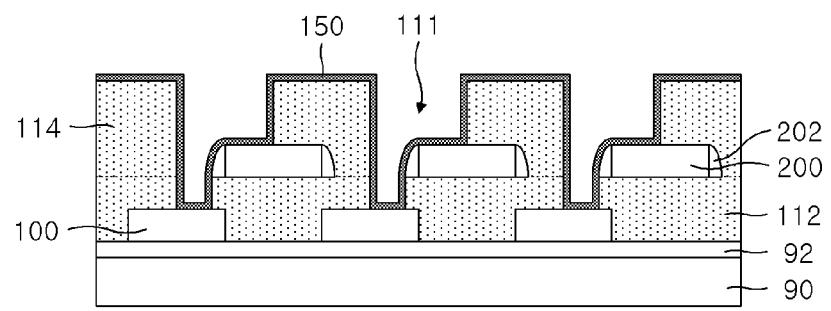
Figure 8D:
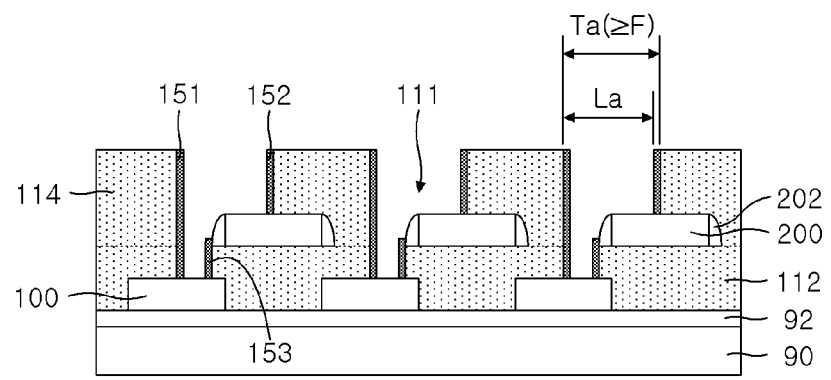

Referring back to FIG. 2A, a plurality of the first lower electrodes 151 may be formed to have a line shape extending along the running direction of the first conductive lines 100 (or the Y-direction). Similarly, a plurality of the second lower electrodes 152 may be formed to have a line shape extending along the running direction of the second conductive lines 200 (or the Y-direction). The first and second lower electrodes 151 and 152 may be formed using the same (and single) process; for instance, as shown in FIGS. 8B through 8D, the formation of the first and second lower electrodes 151 and 152 may include forming a trench 111 having a width Ta substantially identical to the minimum feature size F, depositing a conductive layer in the trench 111, and then patterning the conductive layer. In this case, the first and second lower electrodes 151 and 152 may be alternatingly arranged with a pitch La, which may be smaller than the minimum feature size F. In other embodiments, in the case that the trench 111 is formed to have the width Ta greater than the minimum feature size F, the first and second lower electrodes 151 and 152 may be alternatingly arranged with the pitch La, which may be substantially equivalent to or greater than the minimum feature size F. Sidewall spacers 202 may be disposed on both sidewalls of the respective second conductive lines 200. A dummy electrode 153 may be interposed between the first lower electrode 151 and the sidewall spacer 202. The dummy electrode 153 may have a line shape extending along the Y-direction. Each of the dummy electrodes 153 may be connected to the corresponding one of the first conductive lines 100 and extending vertically toward the second conductive lines 200. The sidewall spacer 202 may prevent the first and second conductive lines 100 and 200 from making a short circuit. The dummy electrodes 153 may be formed using the formation process of the first and second lower electrodes 151 and 152. This will be described in further detail with reference to FIGS. 8A through 8E.

In other embodiments, as shown in FIG. 2D, each of the first lower electrodes 151 may have an island shape confined within the corresponding one of intersections of the first and third conductive lines 100 and 500. Similarly, each of the second lower electrodes 152 may have an island shape confined within the corresponding one of intersections of the second and third conductive lines 200 and 500. Each of the dummy electrodes 153 may have an island shape confined within the corresponding one of intersections of the first and third conductive lines 100 and 500. A semiconductor memory device 11 of FIG. 2D may be configured to have the same technical features as the semiconductor memory device 10 of FIG. 2A.

Referring back to FIG. 2A, the semiconductor memory device 10 may be classified according to a material of the data storing layer 300. For instance, in the case that the data storing layer 300 includes a phase changeable material (for instance, Ge—Sb—Te or Ge—Te), the semiconductor memory device 10 may be classified into a PRAM device. Alternatively, in the case that the data storing layer 300 includes a transition metal oxide (for instance, TiOx or HfOx), the semiconductor memory device 10 may be classified into a RRAM device. Differently, in the case that the data storing layer 300 includes magnetic materials (for instance, CoFe/Cu/CoFe or NiFe/MgOx/NiFe), the semiconductor memory device 10 may be classified into an MRAM device.

Referring to FIG. 2C in conjunction with FIG. 2A, the first conductive lines 100 may correspond to word lines W10, W11 and W12 positioned on the first plane, the second conductive lines 200 may correspond to word lines W20, W21 and W22 positioned on the second plane, and the third conductive lines 500 may correspond to bit lines BL0 and BL1 positioned on the third plane.

In operation, one of the bit lines (e.g., BL0) is connected to a voltage of Vw capable of inducing electric current enough to switch resistance state of the data storing layer 300, and the other of the bit lines (e.g., BL1) is connected to a voltage of Vw/2. One of the word lines (e.g., W22) is connected to a ground voltage of 0V, and the others of the word lines (e.g., W10-W21) are connected to the voltage of Vw/2. In this case, since a voltage difference of Vw is produced between both ends of a memory cell M located at the intersection of the word line W22 and the bit line BL0, the memory cell M can be switched between the high and low resistance states. This may be used to change a data stored in the memory cell M. By contrast, the remaining memory cells, except for the memory cell M, may have a voltage difference of Vw/2 or 0V that is too small to switch the resistance state, and thus, an unintended writing thereon can be prevented.

In some embodiments, the semiconductor memory device 10 may be provided without an additional selection device. For all that, each memory cell can be selectively accessed using the rectifying property of junctions, which may be formed between the first and second lower electrodes 151 and 152 and the data storing layer 300. In more detail, in the case that a first electric current 1a passing through the memory cell M is measured to read out a data stored in the memory cell M, the measurement of 1a may be disturbed due to the presence of a second electric current 1b passing through unselected memory cells, for instance, provided at intersections of the word line W22 and the bit line BL1 and/or of the word line W12 and the bit lines BL0 and BL1. However, according to the present embodiments, the rectifying property of the junctions, formed between the first and second lower electrodes 151 and 152 and the data storing layer 300, can exclude the second electric current 1b from the measurement of 1a. This enables to prevent a read out error from occurring during the operation.

Figure 3A:
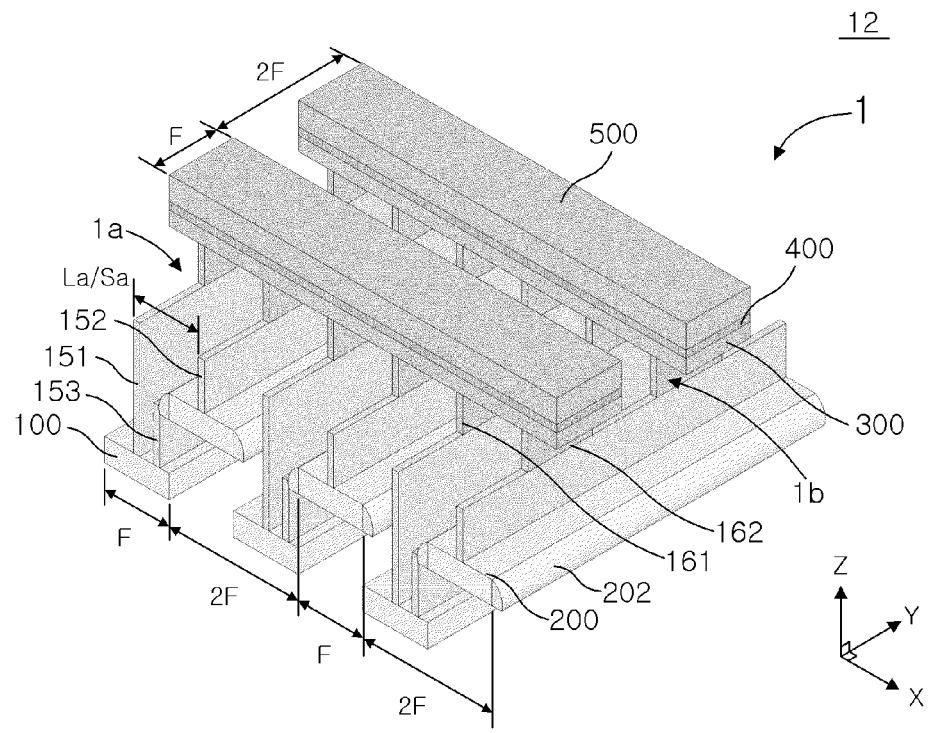
FIG. 3A is a perspective view of a semiconductor memory device according to other exemplary embodiments of the inventive concept.
Figure 3B:
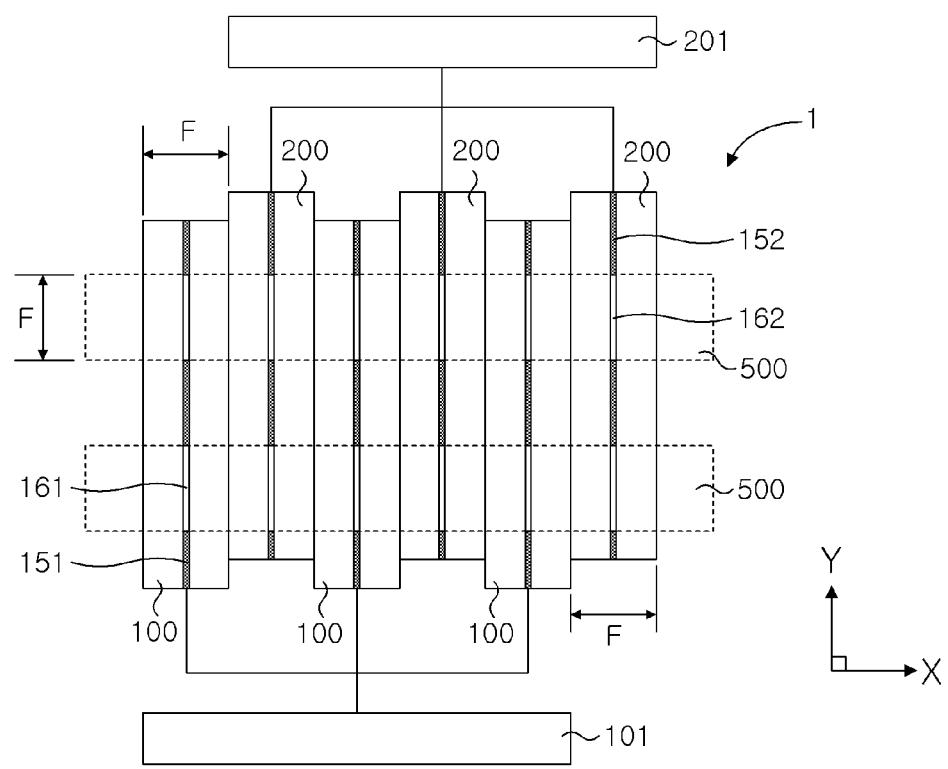
FIG. 3B is a plan view of FIG. 3A.
Figure 3C:
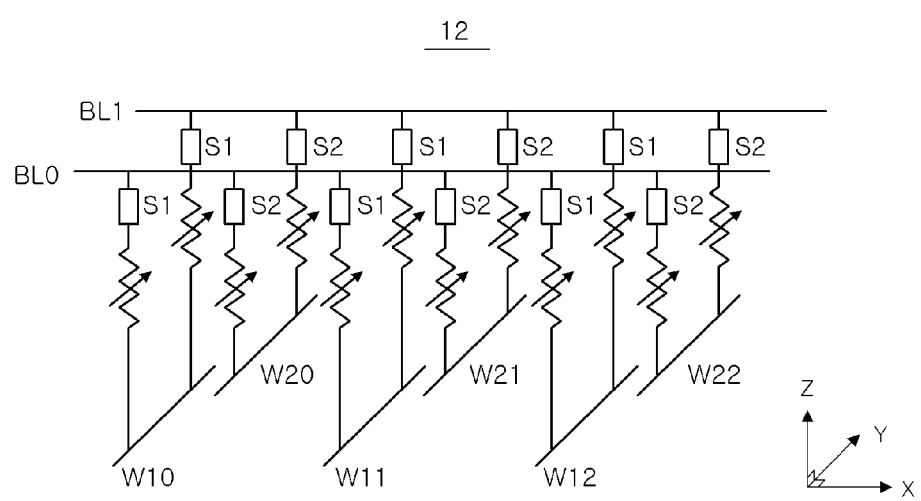
FIG. 3C is an equivalent circuit diagram of FIG. 3A.
Figure 3D:
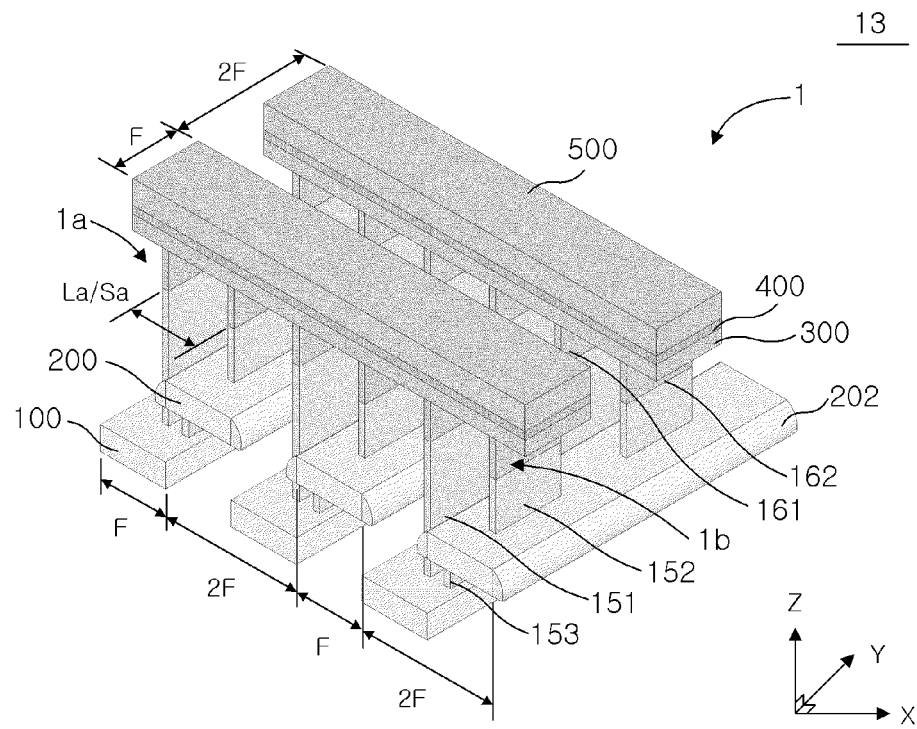
FIG. 3D is a perspective view of a semiconductor memory device according to exemplary embodiments modified from the exemplary embodiments described with reference to FIG. 3A.

FIG. 3A is a perspective view of a semiconductor memory device according to other example embodiments of the inventive concepts. FIG. 3B is a plan view of FIG. 3A, and FIG. 3C is an equivalent circuit diagram of FIG. 3A. FIG. 3D is a perspective view of a semiconductor memory device according to embodiments modified from the embodiments described with reference to FIG. 3A.

Referring to FIG. 3A, a semiconductor memory device 12 may be configured to have the substantially same technical features as the semiconductor memory device 10 of FIG. 2A. For instance, the semiconductor memory device 12 may include a 3D double cross-point array configured to have the memory cell structure 1 shown in FIG. 1A. In some embodiments, the first and second conductive lines 100 and 200 may be arranged vertically spaced apart from each other and horizontally next to or spaced apart from each other, and the third conductive lines 500 may be disposed to cross the first and second conductive lines 100 and 200 and define a plurality of intersections where the first and second memory cells 1a and 1b may be disposed. As shown in FIG. 3B, the first conductive lines 100 may be electrically connected to the first driving circuit 101, and the second conductive lines 200 may be electrically connected to the second driving circuit 201.

The semiconductor memory device 12 may further include a plurality of first selection devices 161 interposed between the first lower electrodes 151 and the data storing layers 300 and a plurality of second selection devices 162 interposed between the second lower electrodes 152 and the data storing layers 300. Each of the first selection devices 161 may be shaped like an island confined within the intersection of the first and third conductive lines 100 and 500. Similarly, each of the second selection devices 162 may be shaped like an island confined within the intersection of the second and third conductive lines 200 and 500 (see FIG. 3A).

In some embodiments, the first and second selection devices 161 and 162 adjacent to each other may be formed using the same and single process, for instance, as described with reference to FIGS. 9A through 9C. The first and second selection devices 161 and 162 may be alternatingly arranged with a pitch Sa that is substantially equivalent to or greater or smaller than the minimum feature size F. The first and second selection devices 161 and 162 may be optionally provided to realize a unidirectional current path between the first and second lower electrodes 151 and 152 and the data storing layers 300.

A plurality of the first selection devices 161 may be disposed on each of the first lower electrodes 151 and the number thereof may be equivalent to the number of the third conductive lines 500 crossing one of the first conductive lines 100. Similarly, a plurality of the second selection devices 162 may be disposed on each of the second lower electrodes 152 and the number thereof may be equivalent to the number of the third conductive lines 500 crossing one of the second conductive lines 200.

In other embodiments, as shown in FIG. 3D, each of the first lower electrodes 151 may have an island shape confined within the corresponding one of intersections of the first conductive lines 100 and the third conductive lines 500, and each of the second lower electrodes 152 may have an island shape confined within the corresponding one of intersections of the second conductive lines 200 and the third conductive lines 500. Each of the dummy electrodes 153 may have an island shape confined within the corresponding one of intersections of the first and third conductive lines 100 and 500. A semiconductor memory device 13 of FIG. 3D may be configured to have the same technical features as the semiconductor memory device 12 of FIG. 3A.

Referring to FIGS. 3C and 3A, the first conductive lines 100 may correspond to the word lines W10, W11 and W12, the second conductive lines 200 may correspond to the word lines W20, W21 and W22, and the third conductive lines 500 may correspond to the bit lines BL0 and BL1. In addition, the elements S1 and S2 depicted in FIG. 3C may correspond to the first selection devices 161 and the second selection devices 162, respectively. The semiconductor memory device 12 may be read out or written in the same manner as those described with reference to FIG. 2C. Even in the case that the first and second lower electrodes 151 and 152 and the data storing layer 300 do not form junctions with a rectifying property, due to the presence of the elements S1 and S2, electric currents passing through the memory cells may be unidirectional or nonlinear according to an applied potential difference. This enables to select uniquely one of the memory cells during a write or reading operation.

Figure 4A:
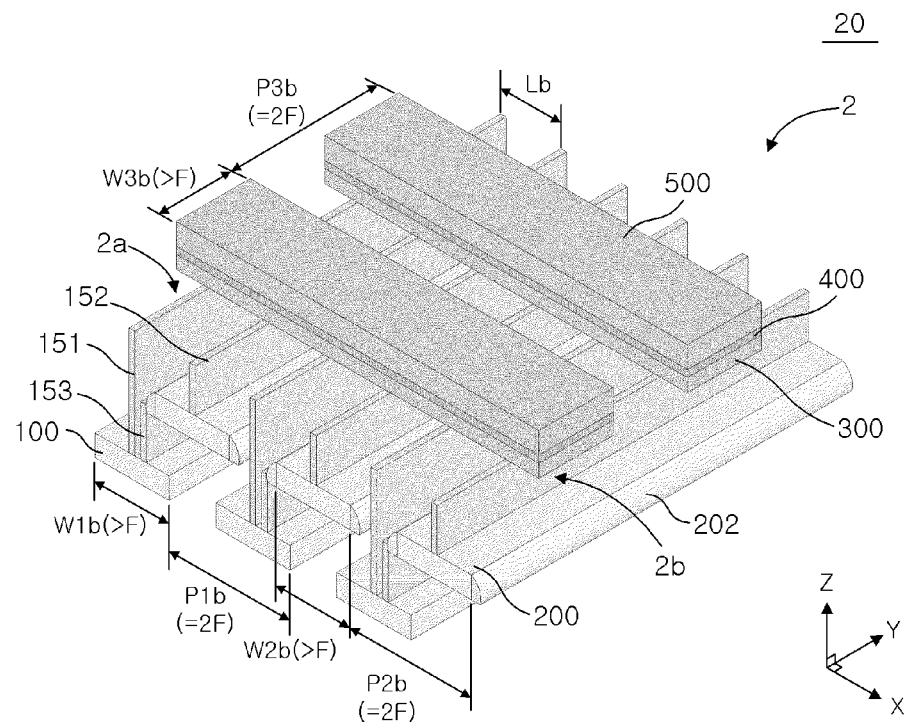
FIG. 4A is a perspective view of a semiconductor memory device according to still other exemplary embodiments of the inventive concept.
Figure 4B:
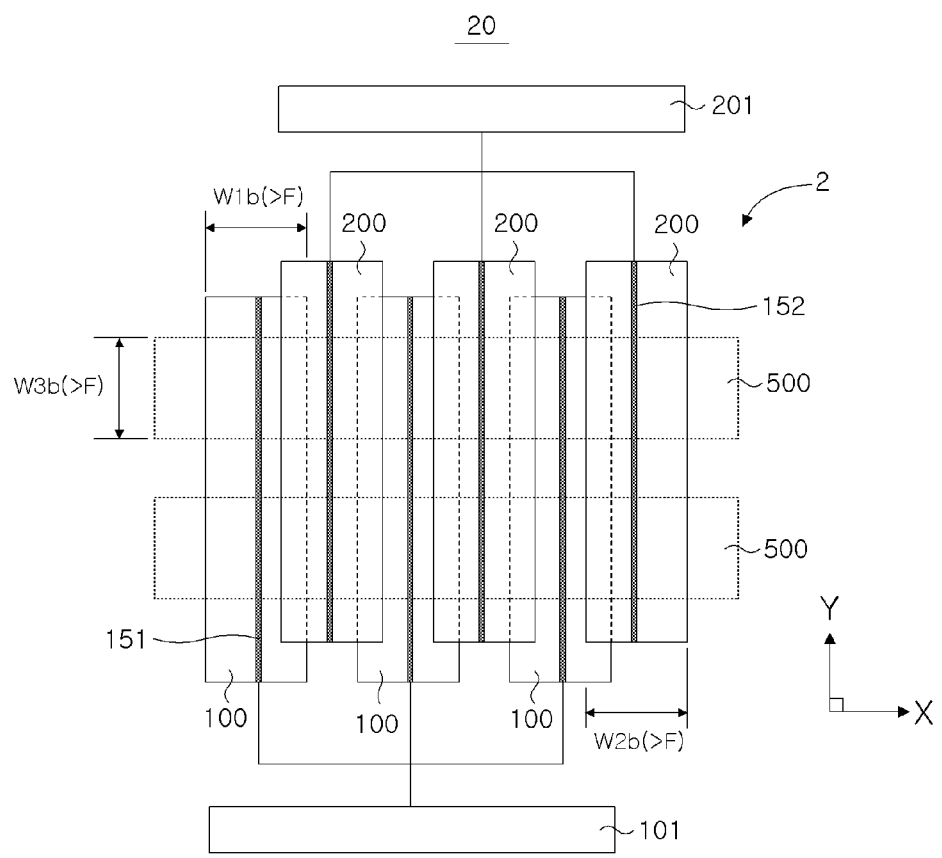
FIG. 4B is a plan view of FIG. 4A.
Figure 4C:
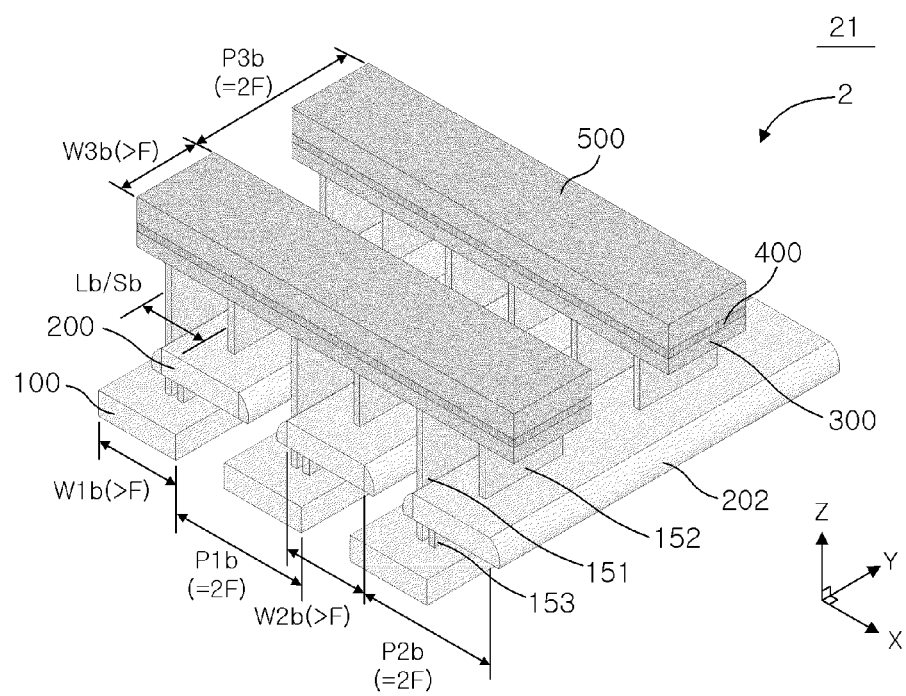
FIG. 4C is a perspective view of a semiconductor memory device according to exemplary embodiments modified from the exemplary embodiments described with reference to FIG. 4A.

FIG. 4A is a perspective view of a semiconductor memory device according to still other example embodiments of the inventive concepts. FIG. 4B is a plan view of FIG. 4A, and FIG. 4C is a perspective view of a semiconductor memory device according to embodiments modified from the embodiments described with reference to FIG. 4A. For concise description, overlapping description of elements previously described with reference to FIGS. 2A through 2D may be omitted.

Referring to FIG. 4A, a semiconductor memory device 20 may include the 3D double cross-point array configured to have the memory cell structure 2 shown in FIG. 1B. Similar to FIG. 2A, the semiconductor memory device 20 may include the first and second conductive lines 100 and 200 extending along the Y-direction and disposed at different levels and the third conductive lines 500 extending along the X-direction. In other words, the first and second conductive lines 100 and 200 may be arranged to cross the third conductive lines 500, thereby defining a plurality of intersections. A plurality of the first and second memory cells 2a and 2b may be disposed at the intersections. As shown in FIG. 4B, the first conductive lines 100 may be electrically connected to the first driving circuit 101, and the second conductive lines 200 may be electrically connected to the second driving circuit 201. The semiconductor memory device 20 may be configured to form the equivalent circuit diagram of FIG. 2C.

The first conductive lines 100 may be formed to have the width W1b greater than the minimum feature size F and be arranged in the X-direction with a pitch P1b substantially identical to 2 F. The second conductive lines 200 may be formed to have the width W2b greater than the minimum feature size F and be arranged in the X-direction with a pitch P2b substantially identical to 2 F. The second conductive lines 200 may be vertically disposed at a higher level than the first conductive lines 100 and horizontally overlap with a portion of the first conductive lines 100. The first and second conductive lines 100 and 200 may horizontally overlap with each other and be alternatingly arranged in the X-direction. According to the present embodiments, it is possible to reduce resistances of the first and second conductive lines 100 and 200 and to maximally reduce the horizontal space between the first and second conductive lines 100 and 200.

The width W3b of the third conductive line 500 may be greater than the minimum feature size F. This enables to reduce resistance of the third conductive line 500. In other embodiments, the width W3b of the third conductive line 500 may be substantially equal to the minimum feature size F. The first and second lower electrodes 151 and 152 may be alternatingly arranged with the pitch Lb, which may be equivalent to or smaller or greater than the minimum feature size F. The first and second lower electrodes 151 and 152 may be shaped like a line extending along the Y-direction.

FIG. 4C shows a semiconductor memory device 21 modified from embodiments described with reference to FIG. 4A. As shown in FIG. 4C, the first lower electrode 151 may be shaped like an island confined at an intersection of the first conductive line 100 and the third conductive line 500, and the second lower electrode 152 may be shaped like an island confined at an intersection of the second conductive line 200 and the third conductive line 500. Other aspects of the semiconductor memory device 21 may be configured as those of the semiconductor memory device 20 of FIG. 4A.

Figure 5A:
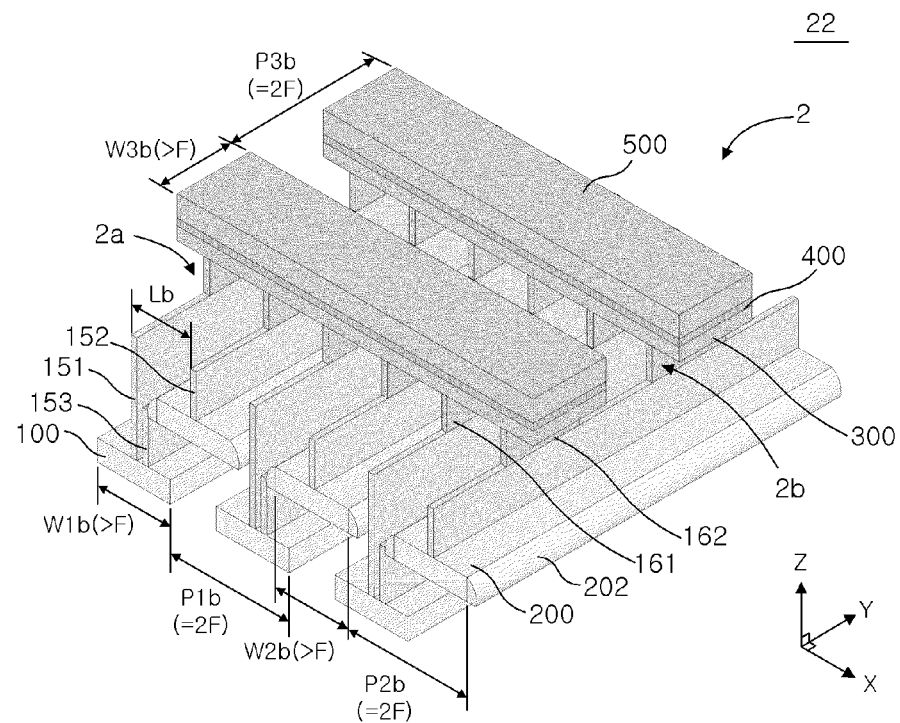
FIG. 5A is a perspective view of a semiconductor memory device according to yet other exemplary embodiments of the inventive concept.
Figure 5B:
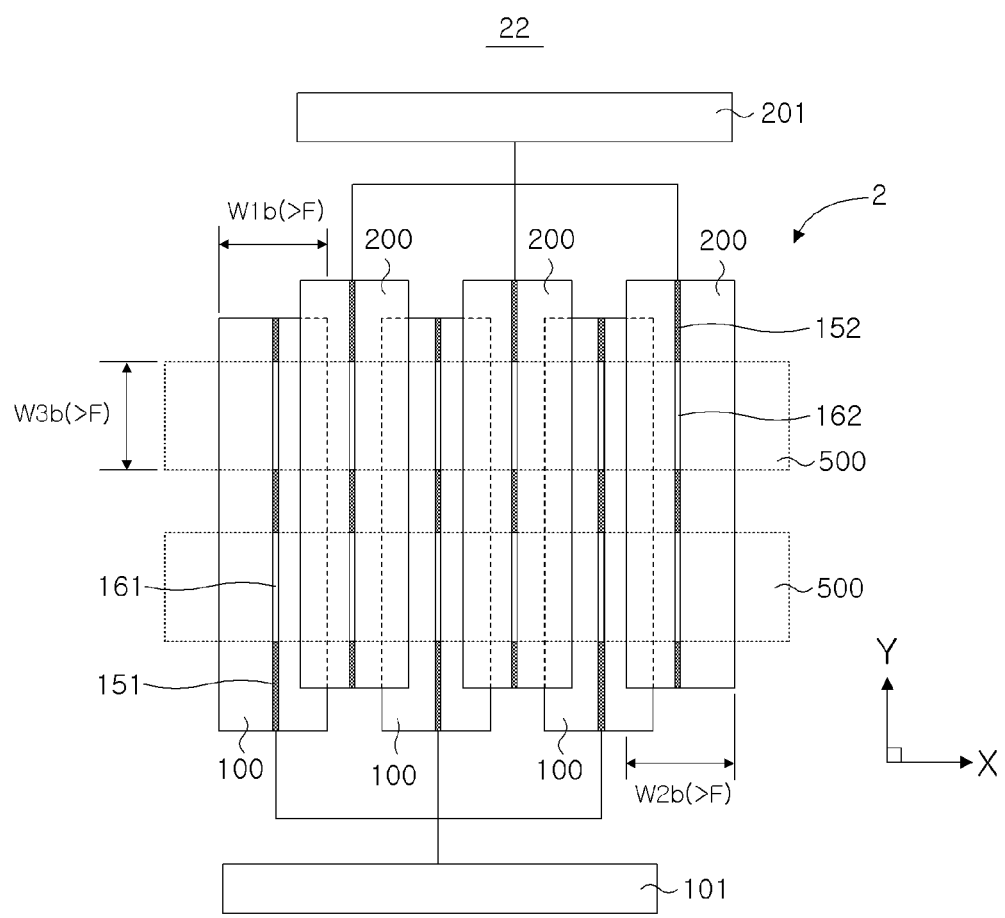
FIG. 5B is a plan view of FIG. 5A.
Figure 5C:
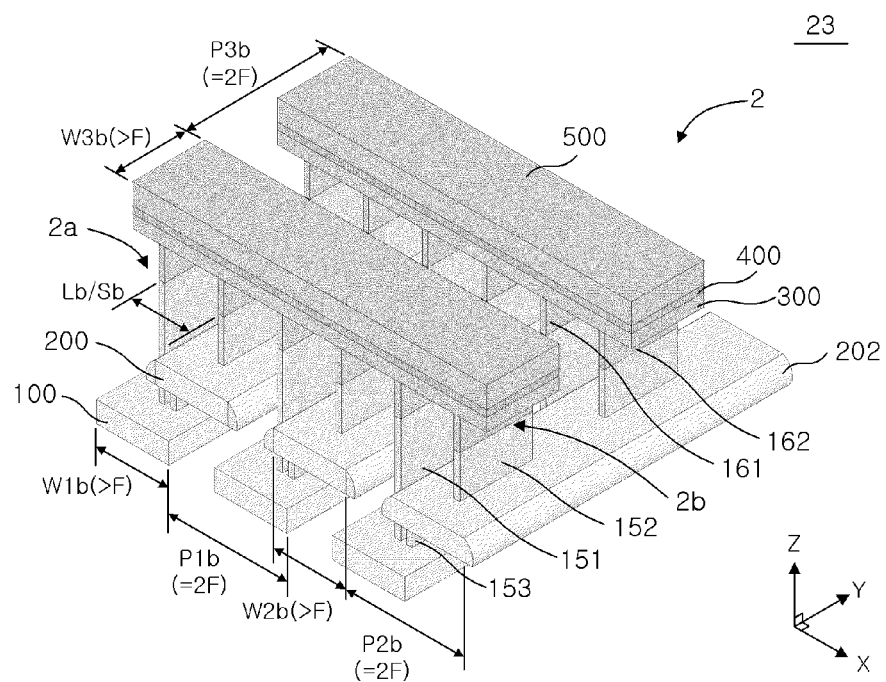
FIG. 5C is a perspective view of a semiconductor memory device according to exemplary embodiments modified from the exemplary embodiments described with reference to FIG. 5A.

FIG. 5A is a perspective view of a semiconductor memory device according to yet other example embodiments of the inventive concept. FIG. 5B is a plan view of FIG. 5A, and FIG. 5C is a perspective view of a semiconductor memory device according to embodiments modified from the embodiments described with reference to FIG. 5A.

Referring to FIG. 5A, a semiconductor memory device 22 may be configured to have the substantially same technical features as the semiconductor memory device 20 of FIG. 4A. For instance, the semiconductor memory device 22 may include a 3D double cross-point array configured to have the memory cell structure 2 shown in FIG. 1B. In some embodiments, the first and second conductive lines 100 and 200, which may be arranged vertically spaced apart from each other and horizontally overlap with each other, may cross the third conductive lines 500 to define intersections, at which the first and second memory cells 2a and 2b may be disposed. As shown in FIG. 5B, the first conductive lines 100 may be electrically connected to the first driving circuit 101 and the second conductive lines 200 may be electrically connected to the second driving circuit 201. The semiconductor memory device 22 may be configured to form the equivalent circuit diagram of FIG. 3C.

When compared with the semiconductor memory device 20, the semiconductor memory device 22 may further include a plurality of the first selection devices 161 disposed between the first lower electrodes 151 and the data storing layers 300 to have an island shape and a plurality of the second selection devices 162 disposed between the second lower electrodes 152 and the data storing layers 300 to have an island shape. Each of the first and second lower electrodes 151 and 152 may have a line shape or an island shape, as shown in FIG. 5A and FIG. 5C, respectively. A semiconductor memory device 23 shown in FIG. 5C may be configured to have the same technical features as the semiconductor memory device 22 of FIG. 5A, except for the shape of the lower electrodes 151 and 152 (i.e., island shape).

Figure 6A:
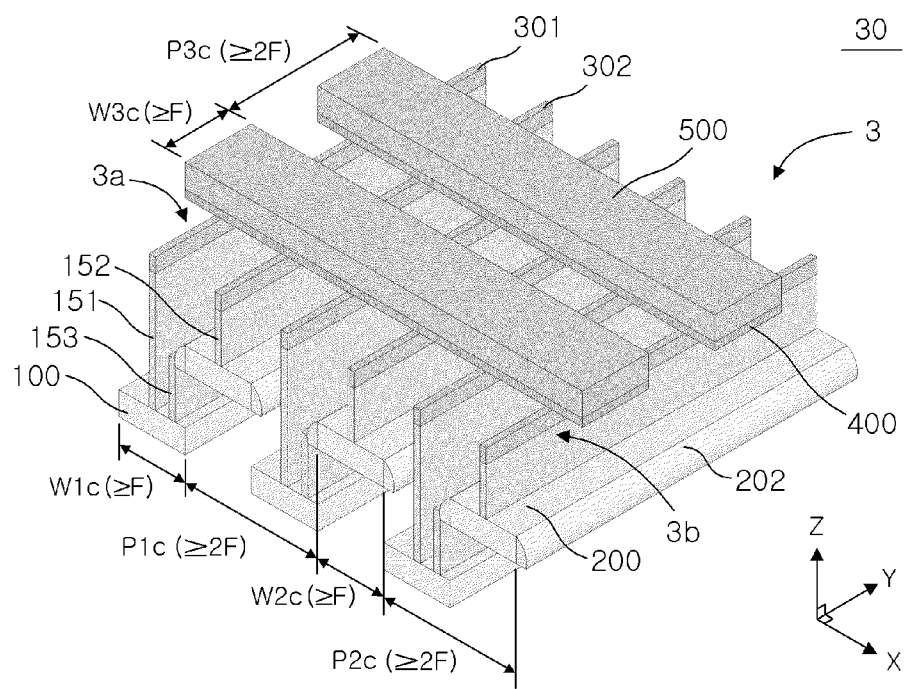
FIG. 6A is a perspective view of a semiconductor memory device according to yet other exemplary embodiments of the inventive concept.
Figure 6B:
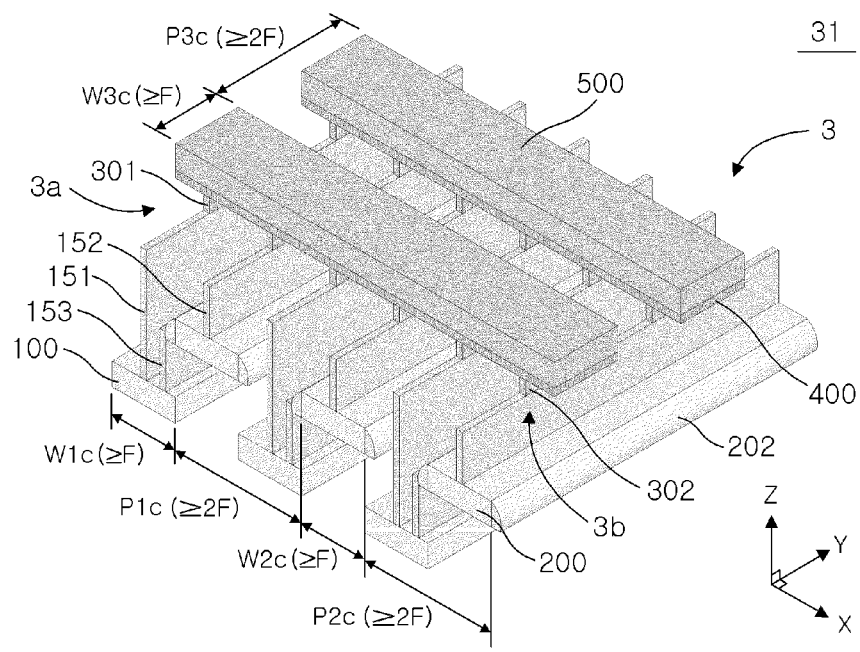
FIGS. 6B and 6C are perspective views of semiconductor memory devices according to embodiments modified from the exemplary embodiments described with reference to FIG. 6A.
Figure 6C:
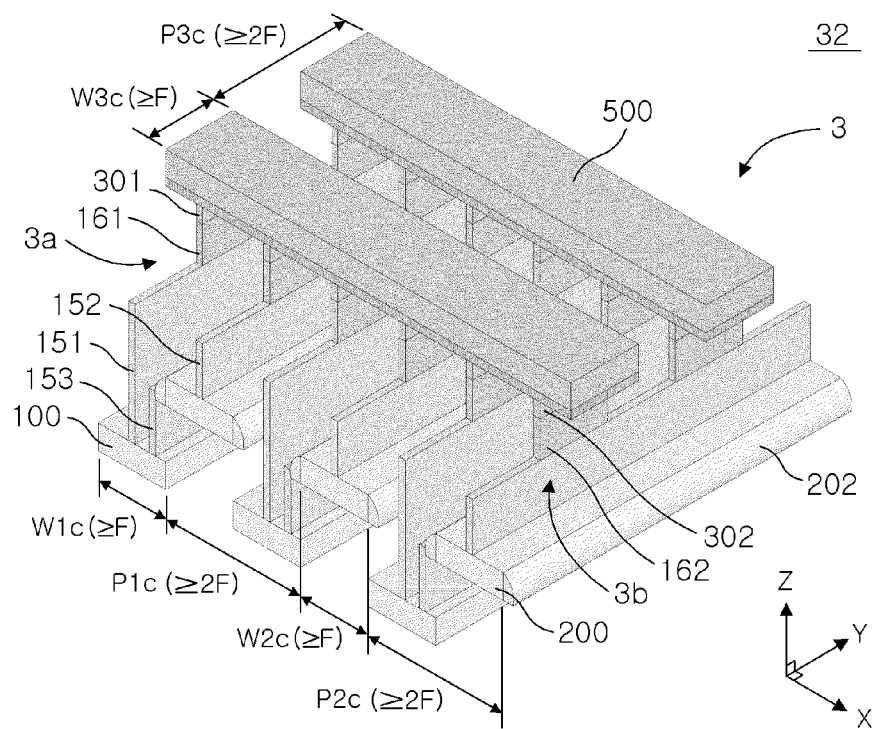

FIG. 6A is a perspective view of a semiconductor memory device according to yet other example embodiments of the inventive concept, and FIGS. 6B and 6C are perspective views of semiconductor memory devices according to embodiments modified from the embodiments described with reference to FIG. 6A.

Referring to FIG. 6A, a semiconductor memory device 30 may include the 3D double cross-point array configured to have the memory cell structure 3 shown in FIG. 10. Similar to FIG. 2A, the semiconductor memory device 30 of FIG. 6A may include the first and second conductive lines 100 and 200 extending along the Y-direction and disposed at different levels and the third conductive lines 500 extending along the X-direction. In other words, the first and second conductive lines 100 and 200 may be arranged to cross the third conductive lines 500, thereby defining a plurality of intersections. A plurality of the first and second memory cells 3a and 3b may be disposed at the intersections. As shown in FIG. 2B, the first conductive lines 100 may be electrically connected to the first driving circuit 101 and the second conductive lines 200 may be electrically connected to the second driving circuit 201. The semiconductor memory device 30 may be configured to form the equivalent circuit diagram of FIG. 2C.

The first data layers 301 may be disposed to have a line shape extending along the Y-direction, on the first lower electrodes 151 also having a line shape. The second data layers 302 may be disposed to have a line shape extending along the Y-direction, on the second lower electrodes 152 also having a line shape. In other words, the first and second data layers 301 and 302 may be parallel with each other. The third conductive lines 500 may extend along the X-direction to cross the first and second data layers 301 and 302. The upper electrodes 400 may be interposed between the first and second data layers 301 and 302 and the third conductive lines 500 to extend along the X-direction.

The first conductive lines 100 may be formed to have the width W1c substantially equivalent to the minimum feature size F, similar to the embodiments of FIG. 2A, and be arranged in the X-direction with a pitch P1c substantially equivalent to 2 F. The second conductive lines 200 may be formed to have the width W2c substantially equivalent to the minimum feature size F, and be arranged in the X-direction with a pitch P2c substantially equivalent to 2 F. The second conductive lines 200 may be disposed at a higher vertical level than the first conductive line 100. In some embodiments, the first and second conductive lines 100 and 200 may be alternatingly disposed next to or spaced apart from each other, in plan view.

In other embodiments, the first conductive lines 100 may be formed to have the width W1c greater than the minimum feature size F, similar to the embodiments of FIG. 4A, and be arranged in the X-direction with a pitch P1c substantially equivalent to 2 F. The second conductive lines 200 may be formed to have the width W2c greater than the minimum feature size F, and be arranged in the X-direction with a pitch P2c substantially equivalent to 2 F. The second conductive lines 200 may be disposed at a higher vertical level than the first conductive line 100 and partially overlap with the first conductive lines 100 in a plan view.

The third conductive lines 500 may be formed to have the width W3c substantially equivalent to or greater than the minimum feature size F and be arranged in the Y-direction with a pitch P3c substantially equivalent to 2 F. In other embodiments, at least one of the pitches P1c, P2c and P3c may be greater than 2 F.

FIG. 6B shows a semiconductor memory device 31 modified from embodiments described with reference to FIG. 6A. As shown in FIG. 6B, the first data layers 301 may be disposed at intersections of the first conductive lines 100 and the third conductive lines 500 and the second data layers 302 may be disposed at intersections of the second conductive lines 200 and the third conductive lines 500. Each of the first and second data layers 301 and 302 may be shaped like an island.

FIG. 6C shows another semiconductor memory device 32 modified from embodiments described with reference to FIG. 6A. As shown in FIG. 6C, the semiconductor memory device 32 may further include the first selection devices 161, which may be interposed between the island-shaped first data layers 301 and the line-shaped first lower electrodes 151, and the second selection devices 162, which may be interposed between the island-shaped second data layers 301 and the line-shaped second lower electrodes 152. Each of the first and second selection devices 161 and 162 may be shaped like an island.

Similar to the embodiments of FIG. 2D, at least one of the semiconductor memory devices 30, 31 and 32 may include the first and second lower electrodes 151 and 152 that may be shaped like an island.

Figure 7A:
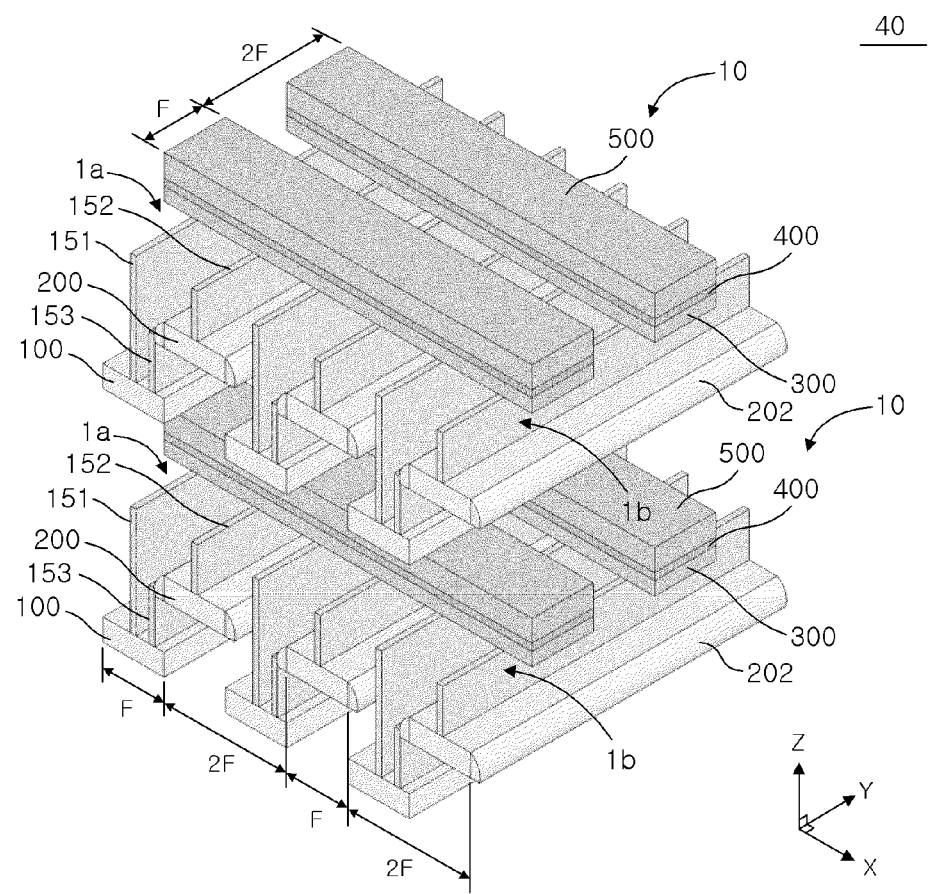
FIG. 7A is a perspective view of a semiconductor memory device according to yet other exemplary embodiments of the inventive concept.
Figure 7B:
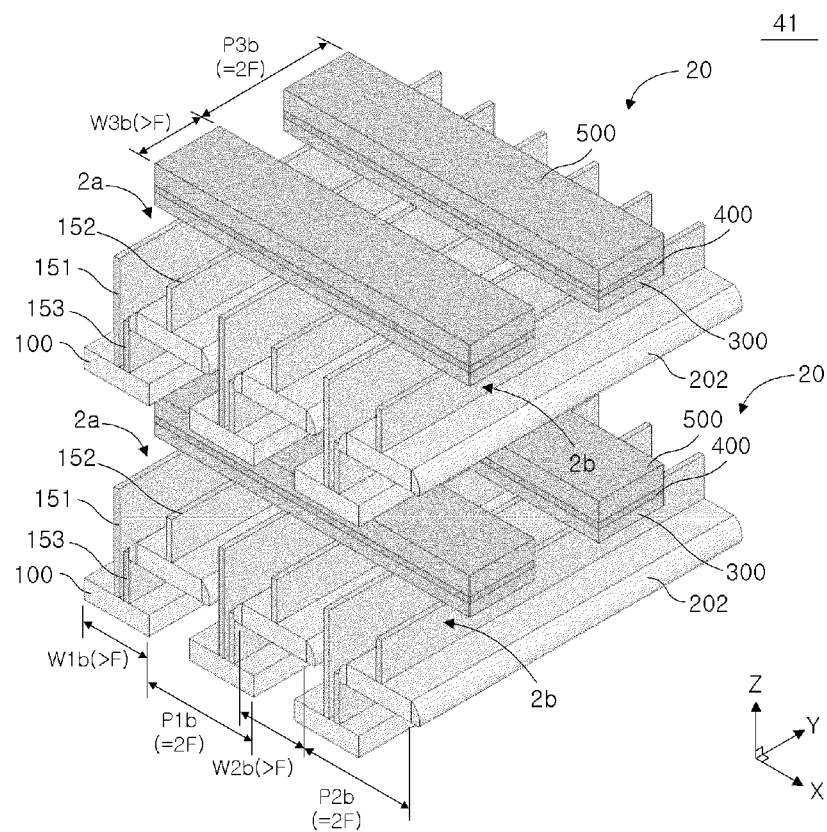
FIGS. 7B and 7C are perspective views of semiconductor memory devices according to embodiments modified from the exemplary embodiments described with reference to FIG. 7A.
Figure 7C:
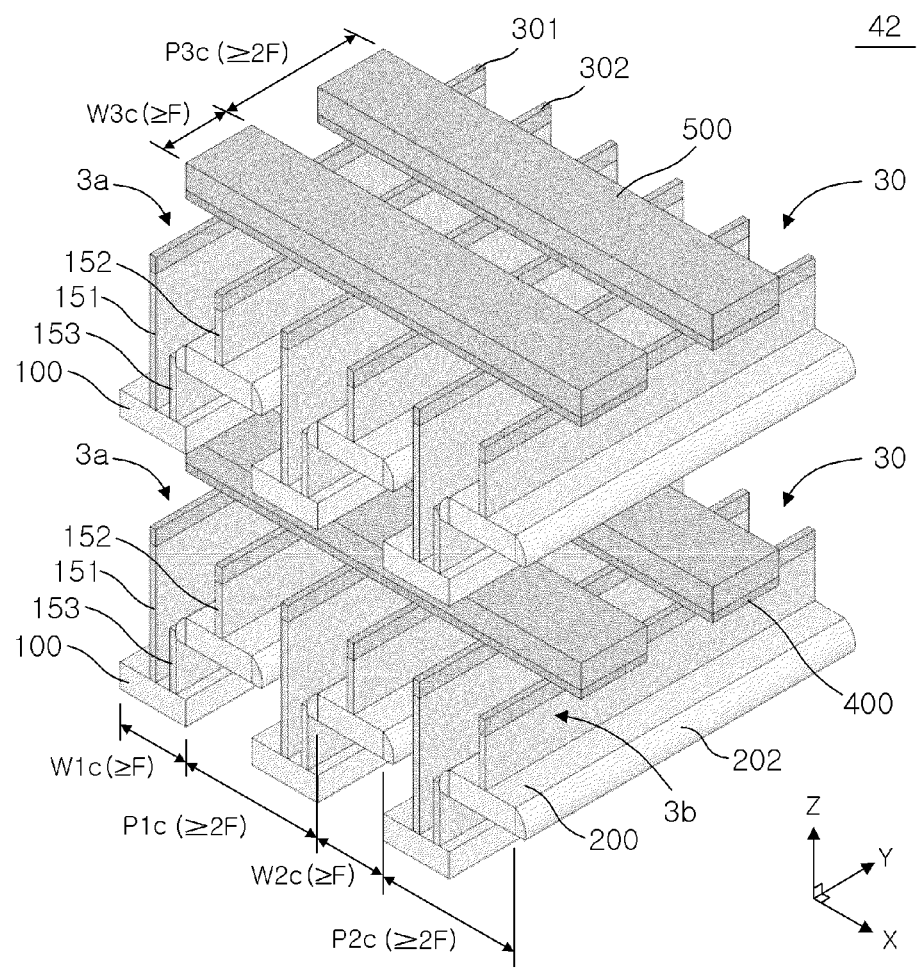

FIG. 7A is a perspective view of a semiconductor memory device according to further example embodiments of the inventive concept, and FIGS. 7B and 7C are perspective views of semiconductor memory devices according to embodiments modified from the embodiments described with reference to FIG. 7A.

Referring to FIG. 7A, a semiconductor memory device 40 may include at least two semiconductor memory devices vertically stacked. At least one of the semiconductor memory devices in the semiconductor memory device 40 may be the semiconductor memory device 10 of FIG. 2A, the semiconductor memory device 11 of FIG. 2D, the semiconductor memory device 12 of FIG. 3A, and/or the semiconductor memory device 13 of FIG. 3D. As a result, the first and second memory cells 1a and 1b may be vertically or three-dimensionally disposed in the semiconductor memory device 40. This enables to increase an integration density of the semiconductor memory device 40.

Referring to FIG. 7B, a semiconductor memory device 41 may include at least two semiconductor memory devices vertically stacked. At least one of the semiconductor memory devices in the semiconductor memory device 41 may be the semiconductor memory device of FIG. 4A, the semiconductor memory device 21 of FIG. 4C, the semiconductor memory device 22 of FIG. 5A, and/or the semiconductor memory device 23 of FIG. 5C. As a result, the first and second memory cells 2a and 2b may be vertically or three-dimensionally disposed in the semiconductor memory device 41. This enables to increase an integration density of the semiconductor memory device 41.

Referring to FIG. 7C, a semiconductor memory device 42 may include at least two semiconductor memory devices vertically stacked. At least one of the semiconductor memory devices in the semiconductor memory device 42 may be the semiconductor memory device 30 of FIG. 6A, the semiconductor memory device 31 of FIG. 6B, and/or the semiconductor memory device 32 of FIG. 6C. As a result, the first and second memory cells 3a and 3b may be vertically or three-dimensionally disposed in the semiconductor memory device 42. This enables to increase an integration density of the semiconductor memory device 42.

FIGS. 8A through 8E are sectional views illustrating methods of fabricating a semiconductor memory device according to example embodiments of the inventive concept.

Referring to FIG. 8A, a plurality of the first conductive lines 100 and a plurality of the second conductive lines 200 may be formed on the substrate 90. The first and second conductive lines 100 and 200 may be spaced apart from each other in a vertical view and extend parallel to each other in a plan view. For instance, the first conductive lines 100 may be disposed at a different vertical level from the second conductive lines 200, and the first and second conductive lines 100 and 200 may be horizontally arranged in an alternating manner. In some embodiments, the second conductive lines 200 may be formed at a higher level than the first conductive lines 100. The insulating layer 92 may be formed between the substrate 90 and the first conductive lines 100 to electrically isolate the first conductive lines 100 from the substrate 90.

The first conductive lines 100 may be formed on the insulating layer 92, and a first interlayer dielectric layer 112 may be formed to cover the first conductive lines 100. The second conductive lines 200 may be formed on the first interlayer dielectric layer 112, and a second interlayer dielectric layer 114 may be formed to cover the second conductive lines 200. In some embodiments, sidewall spacers 202 may be formed to cover both sidewalls of each of the second conductive lines 200. The first and second interlayer dielectric layers 112 and 114 may be formed to have vertical thicknesses equivalent to or different from each other.

The substrate 90 may include a semiconductor substrate, such as a silicon wafer. At least one of the insulating layer 92 and the first and second interlayer dielectric layers 112 and 114 may be formed by depositing at least one of an oxide (e.g., $SiO_x$), a nitride (e.g., $SiN_x$, $SiON_x$) or any combination thereof. The formation of the sidewall spacers 202 may include depositing an insulating material having an etch selectivity with respect to the second interlayer dielectric layer 114 and then patterning the insulating material. In some embodiments, the second interlayer dielectric layer 114 may be formed of an oxide (e.g., $SiO_x$) layer and the sidewall spacer 202 may be formed of a nitride (e.g., $SiN_x$) layer.

The formation of the first and second conductive lines 100 and 200 may include depositing at least one of conductive materials, such as Ti, W, Si, Cu, Ta, Mo, Ru, Al, Au, Pt, Ag, or any combination thereof, and then patterning the conductive material. The first conductive lines 100 may be formed to have the width W1a substantially equivalent to the minimum feature size F, which may be defined as the minimum dimension that the corresponding patterning system can print, and be arranged with the pitch P1a substantially equivalent to 2 F. The second conductive lines 200 may be formed to have the width W2a substantially equivalent to the minimum feature size F and be arranged with the pitch P2a substantially equivalent to 2 F. That is, the widths and pitches may be configured to satisfy the relationship of W1a=W2a=F and P1a=P2a=2 F.

Referring to FIG. 8B, trenches 111 may be formed to expose portions of the first and second conductive lines 100 and 200 disposed adjacent to each other. In some embodiments, the formation of the trenches 111 may include coating and patterning a photoresist layer on the second interlayer dielectric layer 114 to form a mask 94, selectively etching the first and second interlayer dielectric layers 112 and 114 using the mask 94 as an etch mask to form the trenches 111 exposing the portions of the first and second conductive lines 100 and 200 disposed adjacent to each other.

Each of the trenches 111 may be formed to have the width Ta substantially equivalent to or greater than the minimum feature size F and be elongated along the running direction of the first or second conductive lines 100 and 200. In plan view, each of the trenches 111 may partially overlap the first and second conductive lines 100 and 200 disposed adjacent to each other. In some embodiments, the first conductive line 100 may be substantially the same as the second conductive line 200 in terms of area overlapped with the trench 111. For instance, the trench 111 may overlap the first conductive line 100 by a quarter of the pitch P1a or half of the width W1a of the first conductive line 100 and with the second conductive line 200 by a quarter of the pitch P2a or half of the width W2a of the second conductive line 200.

Referring to FIG. 8C, a conductive material layer 150 may be conformally formed on the resultant structure including the trenches 111. The conductive material layer 150 may be in direct contact with the portions of the first and second conductive lines 100 and 200 exposed by the trenches 111. The conductive material layer 150 may be formed of a material having a low reactivity with respect to the data storing layer 300 to be subsequently formed. For instance, the conductive material layer 150 may be formed by depositing at least one of a noble metal (e.g., Pt, Ir, Ru), TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, TaON, Al, W or any combination thereof.

Referring to FIG. 8D, the first and second lower electrodes 151 and 152 may be formed on sidewalls of the trenches 111. The first and second lower electrodes 151 and 152 may be connected to the first and second conductive lines 100 and 200, respectively. The first and second lower electrodes 151 and 152 may be formed by anisotropically etching the conductive material layer 150. In some embodiments, the first and second lower electrodes 151 and 152 may be formed using the same and single process. The first and second lower electrodes 151 and 152 may be shaped like lines extending along the first and second conductive lines 100 and 200, respectively. Also, the first and second lower electrodes 151 and 152 may be formed to have widths smaller than the minimum feature size F. The widths of the first and second lower electrodes 151 and 152 may be substantially determined by a deposition thickness of the conductive material layer 150. The first and second lower electrodes 151 and 152 are disposed within the trench 111 having the width Ta substantially equivalent to or greater than the minimum feature size F. Therefore, a distance between the first and second lower electrodes 151 and 152 may be smaller than the minimum feature size F, when the first and second lower electrodes 151 and 152 are disposed within the trench 111 having the width of F, and the distance between the first and second lower electrodes 151 and 152 may be equivalent to or greater than the minimum feature size F, when the first and second lower electrodes 151 and 152 are disposed within the trench 111 having the width greater than the minimum feature size F. In some embodiments, in at least one of the trenches 111, there may be the dummy electrode 153, which may be a remainder after the anisotropic etching process. The dummy electrode 153 may be in direct contact with the first conductive line 100 and vertically extend toward the second conductive line 200. According to the present embodiments, the sidewall spacer 202 may be formed between the dummy electrode 153 and the second conductive line 200 to prevent them from being in contact with each other. In other words, due to the presence of the sidewall spacer 202, it is possible to prevent the first conductive line 100 and the second conductive line 200 from making a short circuit.

Figure 8E:
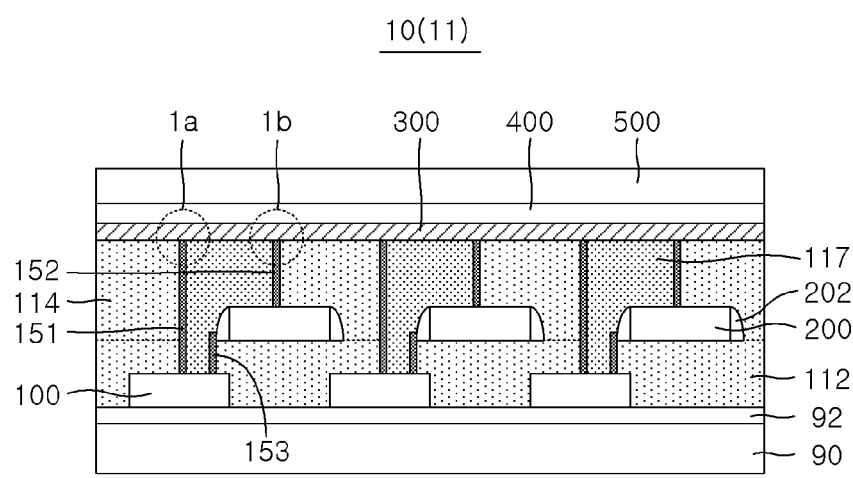

Referring to FIG. 8E, an insulating layer (e.g., SiOx) may be formed to fill the trenches 111 and then be planarized to form a capping insulating layers 117. As the result of the planarization, a top surface of the capping insulating layers 117 may be positioned at the same level as that of the second interlayer dielectric 114. Thereafter, the data storing layer 300, the upper electrode 400, and the third conductive line 500 may be formed on the capping insulating layers 117 and the second interlayer dielectric 114. The data storing layer 300, the upper electrode 400, and the third conductive line 500 may be formed to have a line shape crossing the first conductive lines 100.

The formation of the third conductive line 500 may include depositing at least one of conductive materials (e.g., Ti, W, Si, Cu, Ta, Mo, Ru, Al, Au, Pt, or Ag) and patterning the deposited conductive material. The third conductive lines 500 may be shaped like a plurality of lines as shown in FIG. 2A. In some embodiments, the third conductive lines 500 may be arranged along the running direction of the first or second conductive lines 100 or 200 to cross the first conductive lines 100 and/or the second conductive lines 200 as shown in FIG. 2A. The respective third conductive lines 500 may be formed to substantially have the width W3a of F and the pitch P3a of 2 F.

The formation of the upper electrode 400 and the data storing layer 300 may include depositing the corresponding layers and patterning them using the line-shaped third conductive lines 500 as an etch mask. As a result, each of the upper electrode 400 and the data storing layer 300 may be formed to have the same configuration and shape as the third conductive line 500. For instance, the upper electrode 400 and the data storing layer 300 may be formed to substantially have a width of F and a pitch of 2 F.

The data storing layer 300 may include a material for the RRAM or PRAM. In some embodiments, the material for the RRAM may include at least one of metal oxides or metal nitrides (for instance, NiOx, TiOx, ZrOx, HfOx, CoOx, FeOx, CuOx, AlOx, NbOx, MgOx, VOx, CrOx, ZnOx, BNx, AlNx, TaOx, WOx, NiOx, or any combination thereof). In other embodiments, the material for the RRAM may include at least one of oxide having Perovskite structure (e.g., PrCaMnO and doped-SrTiO). In still other embodiments, the material for the RRAM may include at least one of solid electrolytes (e.g., GeTe and GeS) containing metal ions (e.g., Cu and Ag) with high diffusivity.

The material for the PRAM may include at least one phase changeable material selected from a group of Te, Se, Ge, Ga, Sb, Bi, Pb, Sn, As, S, Si, P, O and any mixture thereof. For instance, the material for the PRAM may include at least one of chalcogenides (such as Ge—Te, Sb—Te, Ge—Sb, Ga—Sb, In—Sb, In—Se, Ge—Sb—Te, Ge—Bi—Te, Ga—Se—Te, Ga—Sb—Te, As—Sb—Te, As—Ge—Sb—Te, Sn—Sb—Te, In—Sn—Sb—Te, Ag—In—Sb—Te, 5A group element-Sb—Te, 6A group element-Sb—Te, 5A group element-Sb—Se, and 6A group element-Sb—Se). In some embodiments, the chalcogenides may be doped with impurities such as N, O, Si or any combination thereof.

In other embodiments, the data storing layer 300 may include a magnetic structure for the MRAM cell. In some embodiments, the magnetic structure for the MRAM cell may include ferromagnetic layers and a non-magnetic conductive layer interposed therebetween or ferromagnetic layers and a non-magnetic insulating layer interposed therebetween. For instance, the ferromagnetic layer may include at least one of CoFe, NiFe, NiFeCo, and CoFeB, and the non-magnetic conductive layer may include at least one of Cr and Cu, and the non-magnetic insulating layer may include at least one of MgOx and AlOx.

The upper electrode 400 may be formed of a metallic material having a low reactivity with respect to the data storing layer 300. For instance, the upper electrode 400 may be formed of at least one of a noble metal (e.g., Pt, Ir, Ru), TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, TaON, Al, W or any combination thereof.

The afore-described process methods may be used to fabricate the semiconductor memory device 10 of FIG. 2A, which includes the line double cross-point array structure with the line-shaped first and second lower electrodes 151 and 152. The double cross-point array structures described with reference to FIGS. 8A through 8E may be vertically stacked to form the stack-type semiconductor memory device 40 of FIG. 7A.

According to the present embodiments, it is possible to form the lower electrodes 151 and 152 connected to the first and second conductive lines 100 and 200 positioned at different levels, respectively, and thus, the two memory cells 1a and 1b may be simply formed using the same and single process.

In other embodiments, the first and second lower electrodes 151 and 152 may be patterned by an etching process using the third conductive lines 500 as an etch mask. Depending on the etch recipe used in this patterning process, portions of the first and second interlayer dielectrics 112 and 114 and the capping insulating layer 117, which are not covered with the third conductive lines 500, may be selectively removed or not. As the result of the patterning process, each of the first and second lower electrodes 151 and 152 may be patterned to have an island shape, and in this case, the resulting structure may be configured like the semiconductor memory device 11 of FIG. 2D.

Figure 9A:
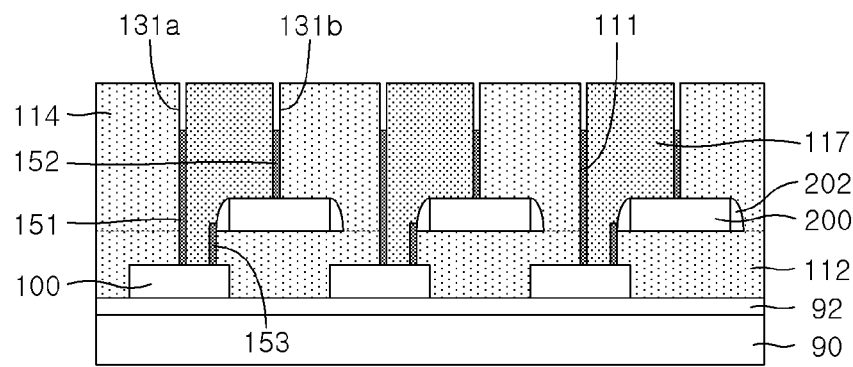
FIGS. 9A through 9C are sectional views illustrating methods of fabricating a semiconductor memory device according to other exemplary embodiments of the inventive concept.
Figure 9B:
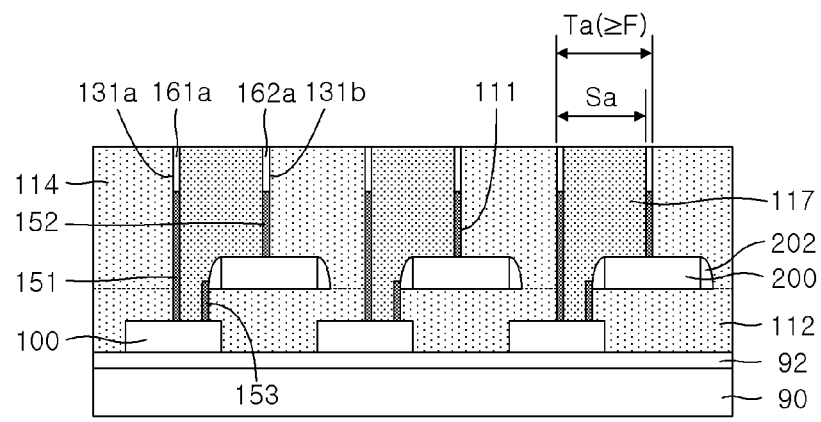
Figure 9C:
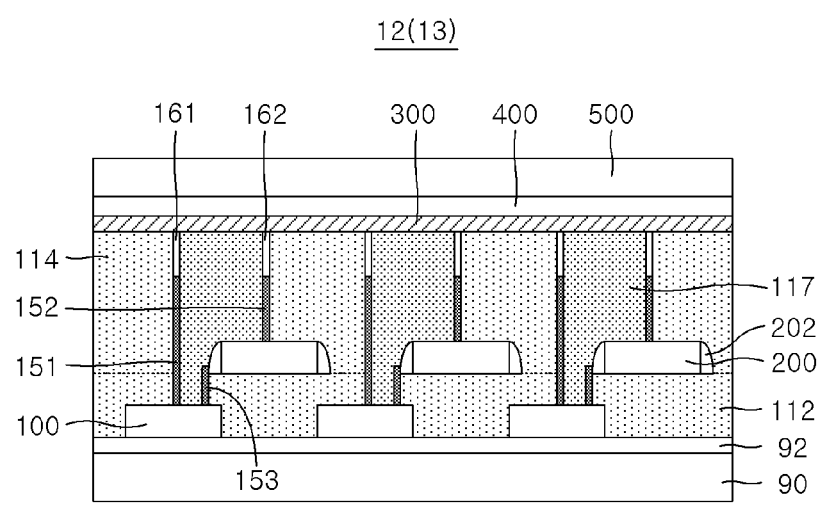

FIGS. 9A through 9C are sectional views illustrating methods of fabricating a semiconductor memory device according to other example embodiments of the inventive concept.

Referring to FIG. 9A, the process described with reference to FIGS. 8A through 8D may be used to form the first and second conductive lines 100 and 200 arranged alternatingly on the substrate 90 in vertical sectional view. The first and second interlayer dielectric layers 112 and 114 may be formed on the substrate 90 to cover the first and second conductive lines 100 and 200, respectively, and then be patterned to form the trenches 111 exposing portions of the first and second conductive lines 100 and 200 disposed adjacent to each other. The first and second lower electrodes 151 and 152 may be formed in the trenches 111, and the capping insulating layers 117 may be formed to fill the trenches 111. The first and second lower electrodes 151 and 152 may be connected to the first and second conductive lines 100 and 200, respectively.

The first and second lower electrodes 151 and 152 may be selectively etched to form first and second recesses 131a and 131b exposing the first and second lower electrodes 151 and 152, respectively, between the first interlayer dielectric 114 and the capping insulating layers 117. The first and second recesses 131a and 131b may extend along the running directions of the first and second conductive lines 100 and 200, respectively.

Referring to FIG. 9B, a first selection device layer 161a may be formed to fill the first recess 131a and a second selection device layer 162a may be formed to fill the second recess 131b. In some embodiments, the first and second selection device layers 161a and 162a may be simultaneously formed using the same and single process. The first and second selection device layers 161a and 162a may be formed of at least one of ZnOx, MgOx, AlOx, p-Si/n-Si, p-NiOx/n-TiOx, and p-CuOx/n-TiOx.

In some embodiments, the formation of the first and second selection device layers 161a and 162a may include forming a selection device material layer (e.g., of ZnOx, MgOx, or AlOx) to a thickness sufficient to fill the first and second recesses 131a and 131b and then planarizing the selection device material layer. In this case, the first selection device layer 161a and the second selection device layer 162a may be formed of the same and single material, i.e., the selection device material layer. In other embodiments, the formation of the first and second selection device layers 161a and 162a may include forming a first selection device material layer in the first and second recesses 131a and 131b, recessing the first selection device material layer to defined gap regions, and then, forming a second selection device material layer to fill the gap regions. In this case, each of the first and second selection device layers 161a and 162a may be formed in a double layered structure. One of the first and second selection device material layers may be formed of at least one of p-Si, p-NiOx and p-CuOx, and the other may be formed of at least one of n-Si and n-TiOx.

In some embodiments, the first and second selection device layers 161a and 162a may include at least one of a silicon diode (e.g., p-Si/n-Si), an oxide diode (e.g., p-NiOx/n-TiOx or p-CuOx/n-TiOx) and an oxide layer (e.g., ZnOx, MgOx, or AlOx).

The first and second selection device layers 161a and 162a may be shaped like lines extending along the first and second lower electrodes 151 and 152, respectively. Also, the first and second selection device layers 161a and 162a may be formed to have widths smaller than the minimum feature size F. The first and second selection device layers 161a and 162a may be alternatingly arranged with the pitch Sa, which may be equivalent to or smaller or greater than the minimum feature size F.

Referring to FIG. 9C, the process described with reference to FIG. 8E may be used to form the data storing layers 300, the upper electrodes 400 and the third conductive lines 500 on the capping insulating layers 117 and the second interlayer dielectric 114. The data storing layers 300, the upper electrodes 400 and the third conductive lines 500 may be formed to cross the running direction of the first conductive lines 100. The first and second selection device layers 161a and 162a may be patterned to form the island-shaped first and second selection devices 161 and 162, as shown in FIG. 3A. This patterning process may be performed using the line-shaped third conductive lines 500 as an etch mask. The resulting structure may be configured like the semiconductor memory device 12 of FIG. 3A including the line-shaped first and second lower electrodes 151 and 152 and the island-shaped first and second selection devices 161 and 162. Depending on the etch recipe used in this patterning process, portions of the second interlayer dielectric 114 and the capping insulating layer 117, which are not covered with the third conductive lines 500, may be selectively removed or not.

In other embodiments, the patterning process using the line-shaped third conductive lines 500 as an etch mask may be performed to further etch the line-shaped first and second lower electrodes 151 and 152. The resulting structure may be configured like the semiconductor memory device 13 of FIG. 3D including the island-shaped first and second lower electrodes 151 and 152. Depending on the etch recipe used in this patterning process, portions of the first and second interlayer dielectrics 112 and 114 and the capping insulating layer 117, which are not covered with the third conductive lines 500, may be selectively removed or not.

FIGS. 10A through 10D are sectional views illustrating methods of forming a selection device according to example embodiments of the inventive concept.

Figure 10A:
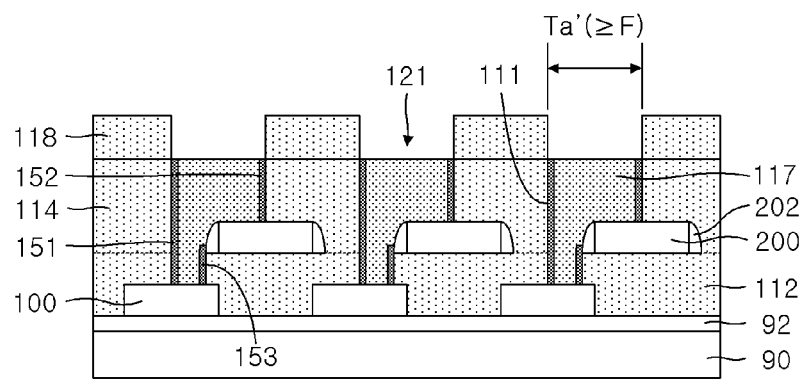
FIGS. 10A through 10D are sectional views illustrating methods of forming a selection device according to exemplary embodiments of the inventive concept.

Referring to FIG. 10A, the process described with reference to FIGS. 8A through 8E may be used to form the first and second conductive lines 100 and 200 arranged alternatingly on the substrate 90 in vertical sectional view, the trenches 111 exposing portions of the first and second conductive lines 100 and 200 disposed adjacent to each other, the first and second lower electrodes 151 and 152 connected to the first and second conductive lines 100 and 200, respectively, in the trenches 111, and the capping insulating layers 117 filling the trenches 111. The formation of the capping insulating layers 117 may include depositing and patterning an insulating layer (e.g., of SiOx). In addition, a third interlayer dielectric 118 may be formed to define a plurality of second trenches 121 exposing the first and second lower electrodes 151 and 152. Each of the second trenches 121 may be formed to have a width Ta' substantially equivalent to or greater than the minimum feature size F and be elongated along the running direction of the first conductive line 100. The second trenches 121 may be vertically aligned with the trenches 111.

Figure 10B:
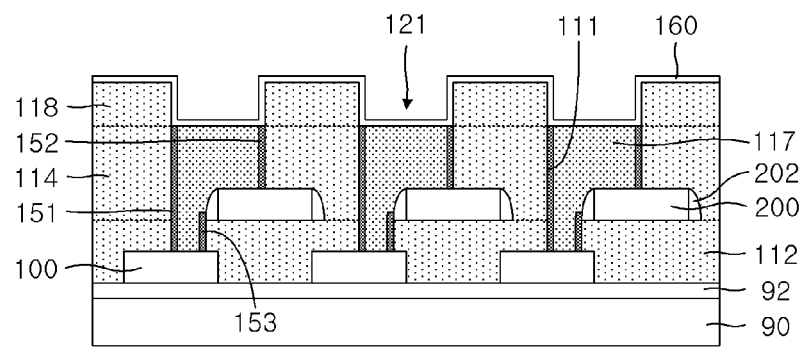
Figure 10C:
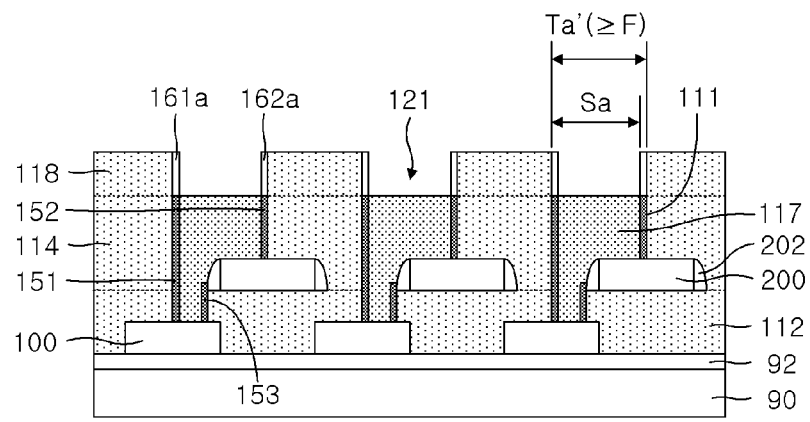

Referring to FIG. 10B, a selection device material layer 160 may be formed on the resultant structure provided with the third interlayer dielectric 118. The selection device material layer 160 may be conformally formed on the resultant structure provided with the third interlayer dielectric 118. The selection device material layer 160 may include at least one of ZnOx, MgOx, and AlOx, which may be formed using a deposition process. The thickness of the selection device material layer 160 may be controlled by adjusting process parameters of the deposition process.

Referring to FIG. 10O, the selection device material layer 160 may be patterned to form the first and second selection device layers 161a and 162a connected to the first and second lower electrodes 151 and 152, respectively. The formation of the first and second selection device layers 161a and 162a may include anisotropically etching the selection device material layer 160. In this case, the first and second selection device layers 161a and 162a may be locally and simultaneously formed on sidewalls of the second trenches 121. The first and second selection device layers 161a and 162a may be shaped like lines extending along the first and second lower electrodes 151 and 152, respectively. Also, the first and second selection device layers 161a and 162a may be formed to have widths smaller than the minimum feature size F. The first and second selection device layers 161a and 162a may be alternatingly arranged with the pitch Sa, which may be equivalent to or smaller or greater than the minimum feature size F. The widths of the first and second selection device layers 161a and 162a may be substantially determined by a deposition thickness of the selection device material layer 160.

Figure 10D:
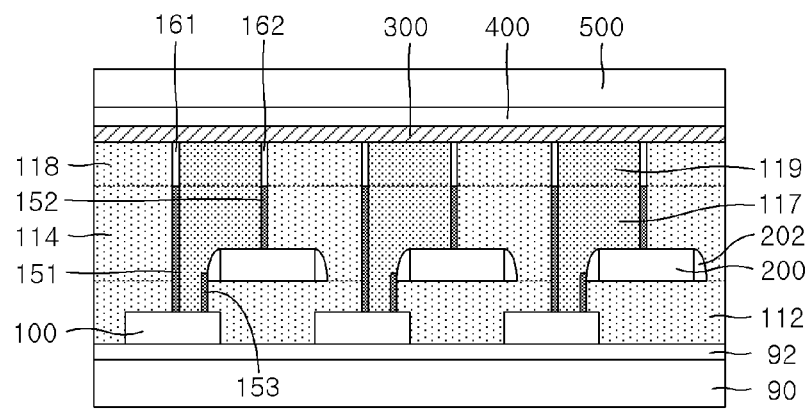

Referring to FIG. 10D, an insulating layer (e.g., SiOx) may be formed to fill the second trenches 121 and then be planarized to form a second capping insulating layer 119. As the result of the planarization, a top surface of the second capping insulating layer 119 may be positioned at the same level as that of the second interlayer dielectric 114. Thereafter, the data storing layer 300, the upper electrode 400, and the third conductive line 500 may be formed on the second capping insulating layer 119 and the second interlayer dielectric 114. The data storing layer 300, the upper electrode 400, and the third conductive line 500 may be formed to have a line shape crossing the first conductive lines 100. The formation of the upper electrode 400 and the data storing layer 300 may include depositing the corresponding layers and patterning them using the line-shaped third conductive lines 500 as an etch mask. As a result, each of the upper electrode 400 and the data storing layer 300 may be formed to have the same configuration and shape as the third conductive line 500.

The first and second selection device layers 161a and 162a may be patterned to form the island-shaped first and second selection devices 161 and 162, as shown in FIG. 3A. This patterning process may be performed using the line-shaped third conductive lines 500 as an etch mask. Depending on the etch recipe used in this patterning process, portions of the third interlayer dielectric 118 and the second capping insulating layers 119, which are not covered with the third conductive lines 500, may be selectively removed or not. The resulting structure may be configured like the semiconductor memory device 12 of FIG. 3A including the line-shaped first and second lower electrodes 151 and 152 and the island-shaped first and second selection devices 161 and 162.

In other embodiments, the patterning process using the line-shaped third conductive lines 500 as an etch mask may be performed to selectively etch the line-shaped first and second lower electrodes 151 and 152. Depending on the etch recipe used in this patterning process, portions of the first and second interlayer dielectric layers 112 and 114 and the capping insulating layer 117, which are not covered with the third conductive lines 500, may be selectively removed or not. The resulting structure may be configured like the semiconductor memory device 13 of FIG. 3D including the island-shaped first and second lower electrodes 151 and 152. In some embodiments, the first and second selection devices 161 and 162 may include at least one of oxide layers, such as, ZnOx, MgOx, or AlOx.

Figure 11A:
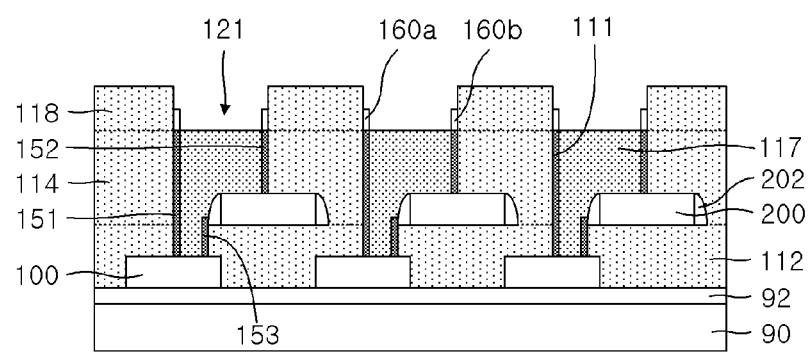
FIGS. 11A through 11C are sectional views illustrating methods of forming a selection device according to modified embodiments of the inventive concept.
Figure 11B:
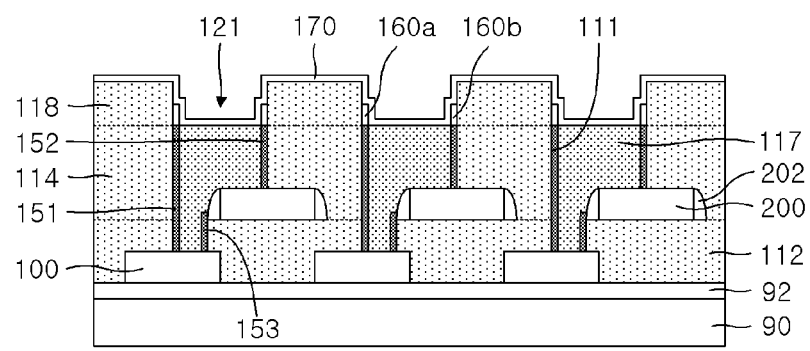
Figure 11C:
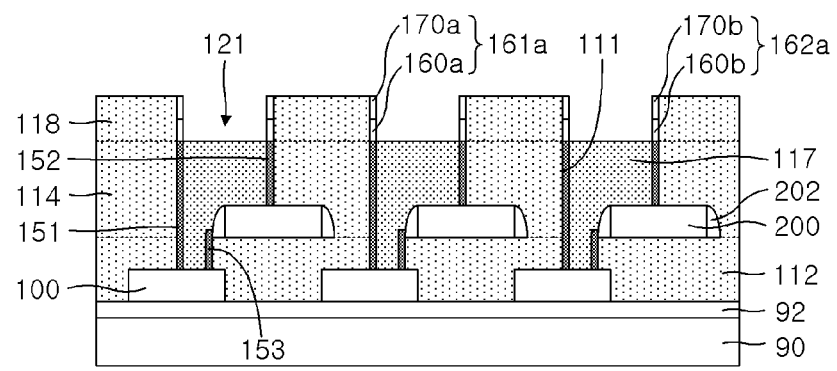

FIGS. 11A through 11C are sectional views illustrating methods of forming a selection device according to modified embodiments of the inventive concepts.

Referring to FIG. 11A, the process described with reference to FIG. 10B may be used to form the selection device material layer 160 and then remove a portion of the selection device material layer 160. For instance, a horizontal portion of the selection device material layer 160 may be selectively removed using an etching process to simultaneously form first and second sub-selection device layers 160a and 160b on the sidewalls of the second trenches 121. The first and second sub-selection device layers 160a and 160b may be formed to have heights smaller than the second trenches 121. The first sub-selection device layers 160a may be formed to have a line shape extending along the running direction of the first lower electrode 151, and the second sub-selection device layers 160b may be formed to have a line shape extending along the running direction of the second lower electrode 152.

Referring to FIG. 11B, a second selection device material layer 170 may be formed. The second selection device material layer 170 may be conformally formed on the third interlayer dielectric layer 118. The second selection device material layer 170 may be formed of a different material from the selection device material layer 160 (hereinafter, first selection device material layer). For instance, the first and second selection device material layers 160 and 170 may be formed of p-Si and n-Si, respectively, or vice versa. In other embodiments, the first selection device material layer 160 may be formed of p-NiOx or p-CuOx and the second selection device material layer 170 may be formed of n-TiOx, or vice versa.

Referring to FIG. 11C, the second selection device material layer 170 may be anisotropically etched to simultaneously form third sub-selection device layers 170a and fourth sub-selection device layers 170b locally disposed on the sidewalls of the second trenches 121. Each of the third and fourth sub-selection device layers 170a and 170b may be shaped like a line. The third sub-selection device layers 170a may be joined with the first sub-selection device layers 160a to form the first selection device layers 161a, and the fourth sub-selection device layers 170b may be joined with the second sub-selection device layers 160b to form the second selection device layers 162a. The process described with reference to FIG. 9D may be used to form the semiconductor memory device 12 of FIG. 3A or the semiconductor memory device 13 of FIG. 3D, which include the island-shaped first and second selection devices 161 and 162. According to the present embodiments, the first and second selection devices 161 and 162 may include at least one of a silicon diode, in which p-Si and n-Si layers are in contact with each other, or an oxide diode, in which p-NiOx and n-TiOx layers or p-CuOx and n-TiOx layers are in contact with each other.

FIGS. 12A through 12D are sectional views illustrating methods of fabricating a semiconductor memory device according to still other example embodiments of the inventive concept.

Figure 12A:
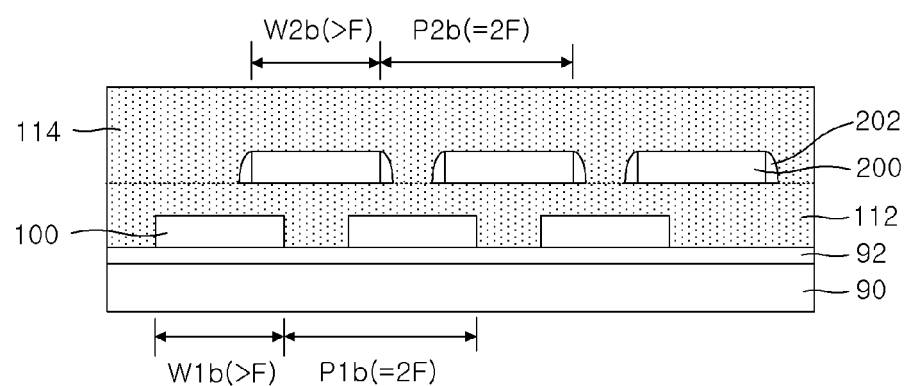
FIGS. 12A through 12D are sectional views illustrating methods of fabricating a semiconductor memory device according to still other exemplary embodiments of the inventive concept.

Referring to FIG. 12A, first conductive lines 100 and second conductive lines 200 may be formed on a substrate 90. An insulating layer 92 may be formed between the substrate 90 and the first conductive lines 100. A first interlayer dielectric layer 112 may be formed between the insulating layer 92 and the second conductive lines 200, and a second interlayer dielectric layer 114 may be formed on the first interlayer dielectric layer 112. In addition, sidewall spacers 202 may be formed to cover sidewalls 202 of the respective second conductive lines 200.

The first conductive lines 100 may be horizontally arranged with a pitch P1b substantially equivalent to 2 F, and the second conductive lines 200 may be disposed at a higher vertical level than the first conductive lines 100 and be horizontally arranged with a pitch P2b substantially equivalent to 2 F. The first conductive lines 100 may be formed to have the width W1b greater than the minimum feature size F, and the second conductive lines 200 may be formed to have the width W2b greater than the minimum feature size F. The widths W1b and W2b may be substantially equivalent to each other. According to the present embodiments, the first and second conductive lines 100 and 200 may partially overlap in a plan view and have a reduced resistance, as compared with the case that the widths W1b and W2b are the same as the minimum feature size F.

Figure 12B:
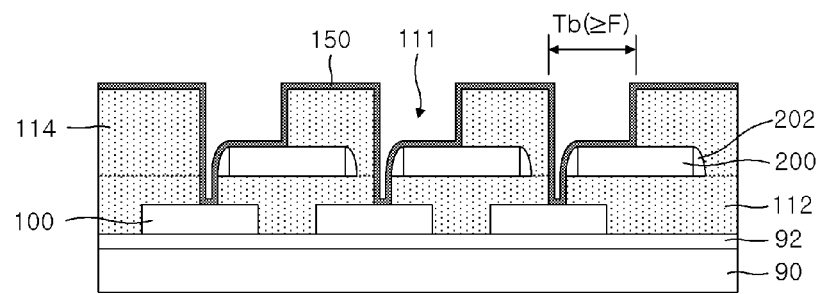

Referring to FIG. 12B, the first and second interlayer dielectric layers 112 and 114 may be selectively etched to form trenches 111 exposing portions of the first and second conductive lines 100 and 200 disposed adjacent to each other. The trenches 111 may be formed to have a width Tb substantially equivalent to or greater than the minimum feature size F. A conductive material layer 150 may be conformally formed on the resultant structure provided with the trenches 111. The conductive material layer 150 may be connected to the portions of the first and second conductive lines 100 and 200 exposed by the trenches 111.

Figure 12C:
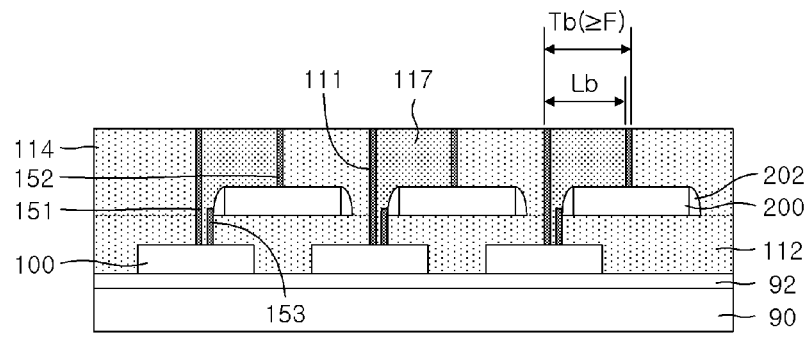

Referring to FIG. 12C, the conductive material layer 150 may be anisotropically etched to simultaneously form the line-shaped first and second lower electrodes 151 and 152, which may be connected to the first and second conductive lines 100 and 200, respectively. The first and second lower electrodes 151 and 152 may be alternatingly arranged with a pitch Lb, which may be substantially equivalent to or greater than the minimum feature size F. Thereafter, capping insulating layers 117 may be formed to fill the trenches 111.

Figure 12D:
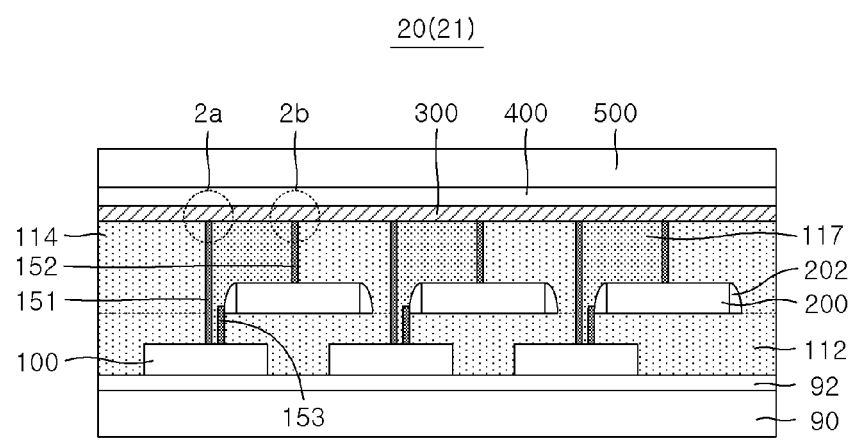

Referring to FIG. 12D, a data storing layer 300, upper electrode 400, and third conductive lines 500 having a line shape may be formed on the second interlayer dielectric layers 114 and the capping insulating layers 117. The resulting structure may be configured like the semiconductor memory device 20 of FIG. 4A, in which two memory cells 2a and 2b are provided between three conductive lines 100, 200 and 500. The third conductive lines 500 may be formed to have the width W3b greater than the minimum feature size F as shown in FIG. 4A and be arranged with a pitch P3b of about 2 F. In other embodiments, the third conductive lines 500 may be formed to have the width W3b substantially equivalent to the minimum feature size F. The double cross-point array structures described with reference to FIGS. 12A through 12D may be vertically stacked to form the stack-type semiconductor memory device 41 of FIG. 7B.

In other embodiments, the line-shaped first and second lower electrodes 151 and 152 may be selectively etched by an etching process using the third conductive lines 500 as an etch mask. As the result of the etching process, each of the first and second lower electrodes 151 and 152 may be formed to have an island shape, and in this case, the resulting structure may be configured like the semiconductor memory device 21 of FIG. 4C.

Figure 13A:
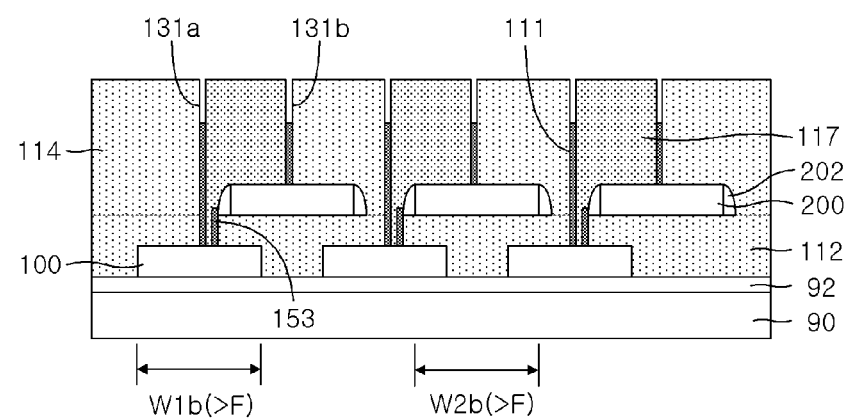
FIGS. 13A through 13C are sectional views illustrating methods of fabricating a semiconductor memory device according to still other exemplary embodiments of the inventive concept.
Figure 13B:
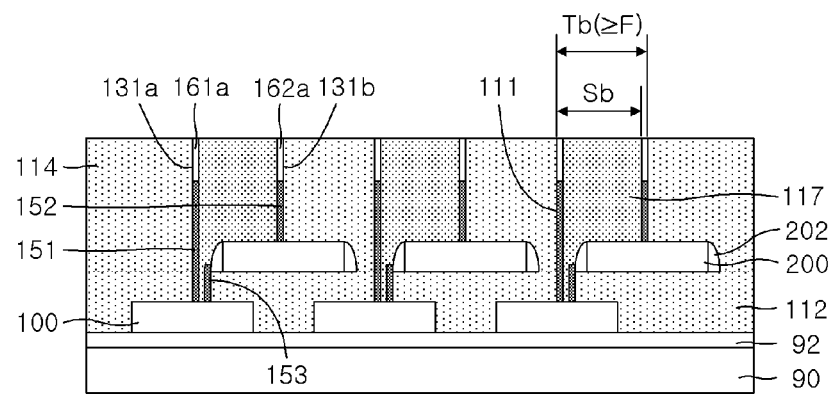
Figure 13C:
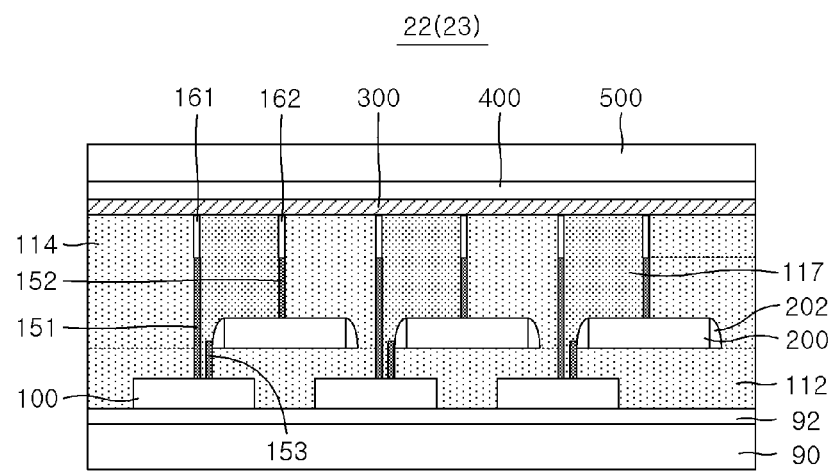

FIGS. 13A through 13C are sectional views illustrating methods of fabricating a semiconductor memory device according to still other example embodiments of the inventive concept.

Referring to FIG. 13A, the process described with reference to FIGS. 12A through 12C may be used to form the first and second conductive lines 100 and 200 arranged alternatingly on the substrate 90 in vertical sectional view, the trenches 111 exposing portions of the first and second conductive lines 100 and 200 disposed adjacent to each other, the first and second lower electrodes 151 and 152 connected to the first and second conductive lines 100 and 200, respectively, in the trenches 111, and the capping insulating layers 117 filling the trenches 111. The formation of the trenches 111 may include forming and patterning the first and second interlayer dielectric layers 112 and 114 covering the first and second conductive lines 100 and 200, respectively.

The first and second lower electrodes 151 and 152 may be selectively etched to form first and second recesses 131a and 131b exposing the first and second lower electrodes 151 and 152, respectively, between the first interlayer dielectric layer 114 and the capping insulating layers 117. The first and second recesses 131a and 131b may extend along the running directions of the first and second conductive lines 100 and 200, respectively.

Referring to FIG. 13B, a first selection device layer 161a may be formed to fill the first recess 131a and a second selection device layer 162a may be formed to fill the second recess 131b. In some embodiments, the first and second selection device layers 161a and 162a may be simultaneously formed using the same and single process. The first and second selection device layers 161a and 162a may be shaped like lines extending along the first and second lower electrodes 151 and 152, respectively. Also, the first and second selection device layers 161a and 162a may be formed to have widths smaller than the minimum feature size F. The first and second selection device layers 161a and 162a may be alternatingly arranged with the pitch Sb, which may be equivalent to or smaller or greater than the minimum feature size F.

In some embodiments, as described with reference to FIG. 9B, the first and second selection device layers 161a and 162a may include an oxide layer including at least one of ZnOx, MgOx and AlOx, a silicon diode including p-Si and n-Si layers, or an oxide diode including p-NiOx and n-TiOx layers or p-CuOx and n-TiOx layers.

Referring to FIG. 13C, the process described with reference to FIG. 12D may be used to form the data storing layers 300, the upper electrodes 400 and the third conductive lines 500 on the capping insulating layers 117 and the second interlayer dielectric 114. The data storing layers 300, the upper electrodes 400 and the third conductive lines 500 may be formed to cross the running direction of the first conductive lines 100. The line-shaped first and second selection device layers 161a and 162a may be patterned to form the island-shaped first and second selection devices 161 and 162, as shown in FIG. 5A. This patterning process may be performed using the line-shaped third conductive lines 500 as an etch mask. The resulting structure may be configured like the semiconductor memory device 22 of FIG. 5A including the line-shaped first and second lower electrodes 151 and 152 and the island-shaped first and second selection devices 161 and 162.

In other embodiments, the patterning process using the line-shaped third conductive lines 500 as an etch mask may be performed to further etch the line-shaped first and second lower electrodes 151 and 152. The resulting structure may be configured like the semiconductor memory device 23 of FIG. 5C including the island-shaped first and second lower electrodes 151 and 152.

In still other embodiments, the first and second selection devices 161 and 162 may be formed by using the process described with reference to FIGS. 10A through 10D or the process described with reference to FIGS. 11A through 11C.

Figure 14A:
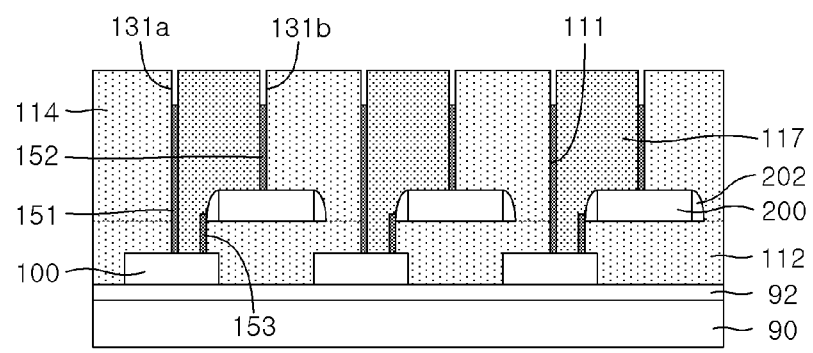
FIGS. 14A through 14C are sectional views illustrating methods of fabricating a semiconductor memory device according to yet other exemplary embodiments of the inventive concept.
Figure 14B:
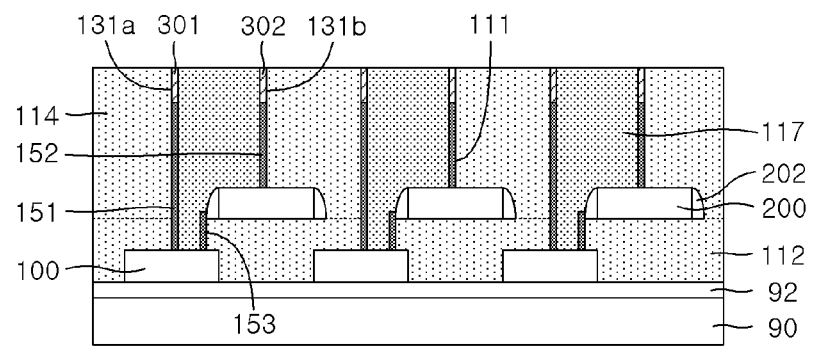
Figure 14C:
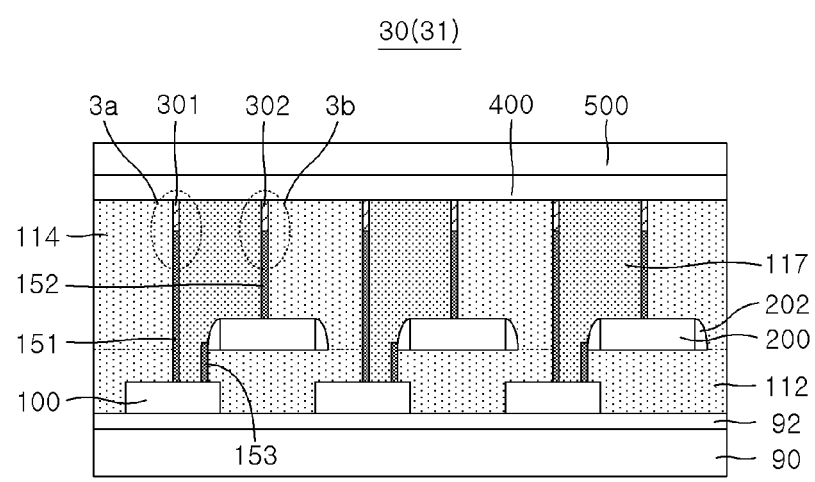

FIGS. 14A through 14C are sectional views illustrating methods of fabricating a semiconductor memory device according to yet other example embodiments of the inventive concept.

Referring to FIG. 14A, first and second conductive lines 100 and 200 may be formed in such a way that they are alternatingly arranged on a substrate 90 in a vertical sectional view. Furthermore, first and second interlayer dielectric layers 112 and 114 may be formed on the substrate 90 to cover the first and second conductive lines 100 and 200. The first and second interlayer dielectric layers 112 and 114 may be patterned to form trenches 111 exposing portions of the first and second conductive lines 100 and 200 disposed adjacent to each other. First and second lower electrodes 151 and 152 may be simultaneously formed in the trenches 111, and capping insulating layers 117 may be formed to fill the trenches 111. The first and second lower electrodes 151 and 152 may be connected to the first and second conductive lines 100 and 200, respectively. In some embodiments, the first and second conductive lines 100 and 200 may be formed to have substantially the same width as the minimum feature size F, similar to the embodiments of FIG. 8A. In other embodiments, the first and second conductive lines 100 and 200 may be formed to have widths greater than the minimum feature size F, similar to the embodiments of FIG. 12A.

The first and second lower electrodes 151 and 152 may be selectively etched to form first and second recesses 131a and 131b exposing the first and second lower electrodes 151 and 152, respectively, between the first interlayer dielectric layer 114 and the capping insulating layers 117. The first and second recesses 131a and 131b may extend along the running directions of the first and second conductive lines 100 and 200, respectively.

Referring to FIG. 14B, first data layers 301 may be formed to fill the first recesses 131a and second data layers 302 may be formed to fill the second recesses 131b. In some embodiments, the first and second data layers 301 and 302 may be simultaneously formed using the same and single process. The first and second data layers 301 and 302 may be shaped like lines extending along the first and second lower electrodes 151 and 152, respectively. Also, the first and second data layers 301 and 302 may be formed to have widths smaller than the minimum feature size F.

Referring to FIG. 14C, the upper electrodes 400 and the third conductive lines 500 may be formed on the capping insulating layers 117 and the second interlayer dielectric layer 114 to cross the running direction of the first and second conductive lines 100 and 200. The upper electrodes 400 and the third conductive lines 500 may be formed to have a line shape. The resulting structure may be configured like the semiconductor memory device 30 of FIG. 6A including the line-shaped first and second data layers 301 and 302. The double cross-point array structures described with reference to FIGS. 14A through 14C may be vertically stacked to form the stack-type semiconductor memory device 42 of FIG. 7C.

In other embodiments, a patterning process using the line-shaped third conductive lines 500 as an etch mask may be performed to further etch the line-shaped first and second data layers 301 and 302. The resulting structure may be configured like the semiconductor memory device 31 of FIG. 6B including the island-shaped first and second data layers 301 and 302.

Figure 15A:
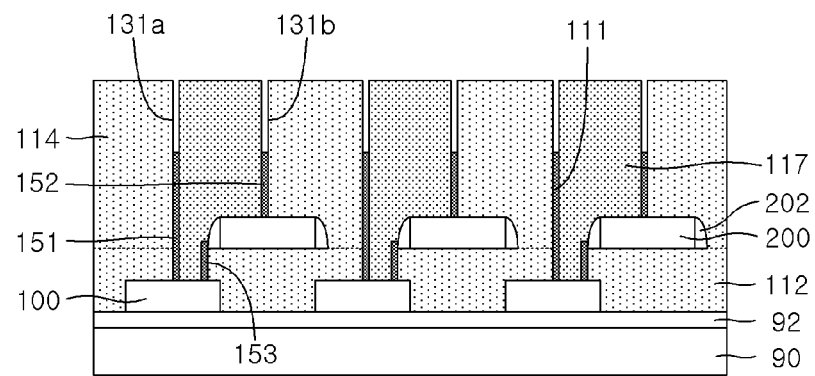
FIGS. 15A through 15C are sectional views illustrating methods of fabricating a semiconductor memory device according to further exemplary embodiments of the inventive concept.
Figure 15B:
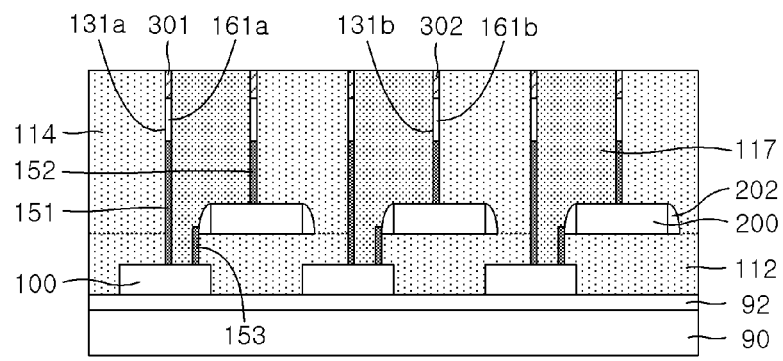
Figure 15C:
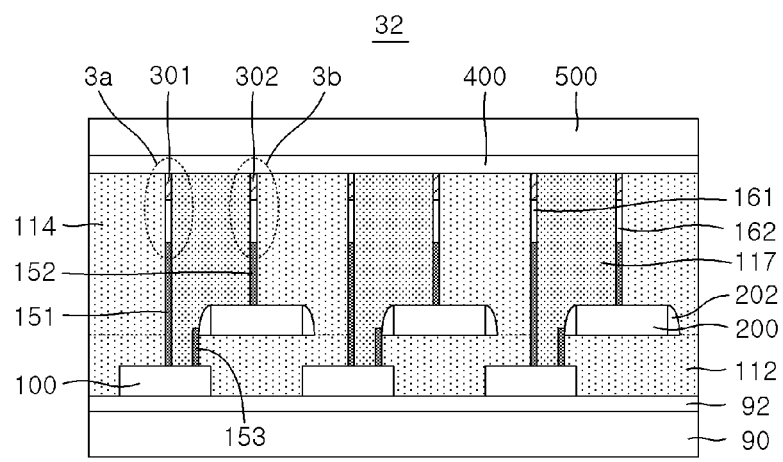

FIGS. 15A through 15C are sectional views illustrating methods of fabricating a semiconductor memory device according to further example embodiments of the inventive concept.

Referring to FIG. 15A, the process described with reference to FIG. 14A may be used to recess the first and second lower electrodes 151 and 152 and form the first and second recesses 131a and 131b.

Referring to FIG. 15B, the first selection device layers 161a and the first data layers 301 may be formed to fill the first recesses 131a, while the second selection device layers 162a and the second data layers 302 may be formed to fill the second recesses 131b. The first selection device layers 161a and the first data layers 301 may be formed to have lines extending along the running direction of the first lower electrode 151, and the second selection device layers 162a and the second data layers 302 may be formed to have lines extending along the running direction of the second lower electrode 152. In some embodiments, the first and second selection device layers 161a and 162a and the first and second data layers 301 and 302 may be formed to have widths smaller than the minimum feature size F.

Referring to FIG. 15C, the upper electrodes 400 and the third conductive lines 500 may be formed on the capping insulating layers 117 and the second interlayer dielectric layers 114 to cross the running direction of the first and second conductive lines 100 and 200. The upper electrodes 400 and the third conductive lines 500 may be formed to have a line shape. A patterning process using the line-shaped third conductive lines 500 as an etch mask may be performed to etch the line-shaped first and second data layers 301 and 302 and the line-shaped first and second selection device layers 161a and 162a. The resulting structure may be configured like the semiconductor memory device 32 of FIG. 6C, in which the island-shaped first selection device 161 and the island-shaped first data layer 301 are disposed on the first lower electrodes 151 and the island-shaped second selection device 162 and the island-shaped second data layer 302 are disposed on the second lower electrodes 152.

Applications of Exemplary Embodiments

Figure 16A:
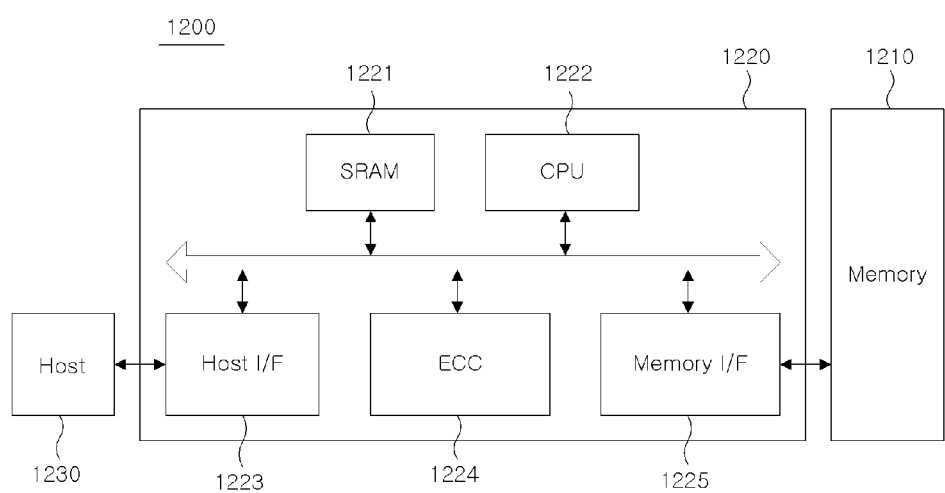
FIG. 16A is a block diagram illustrating a memory card including a semiconductor memory device according to exemplary embodiments of the inventive concept.
Figure 16B:
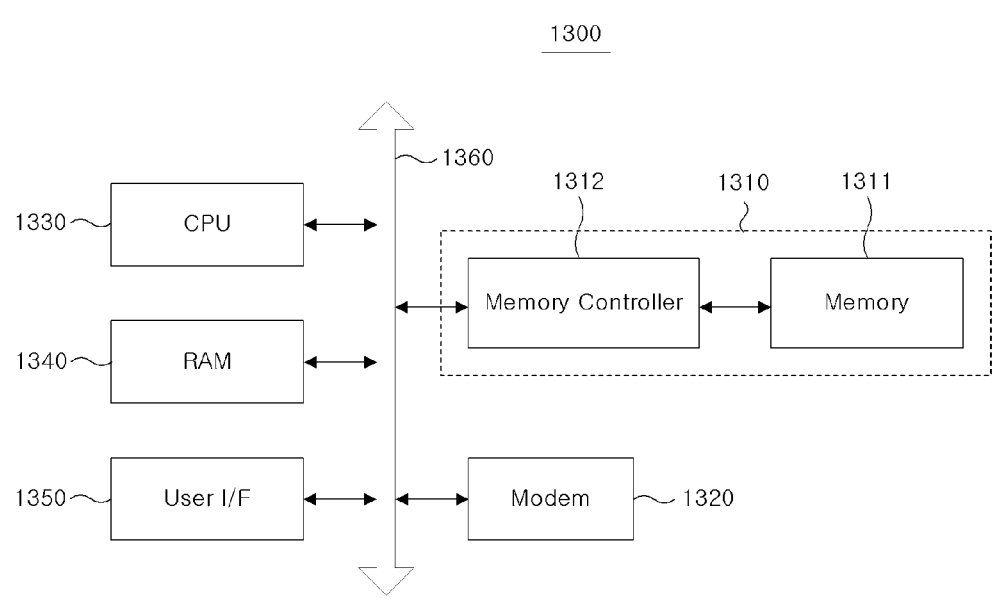
FIG. 16B is a block diagram illustrating an information processing system including a semiconductor memory device according to exemplary embodiments of the inventive concept.

FIG. 16A is a block diagram illustrating a memory card including a semiconductor memory device according to example embodiments of the inventive concepts. FIG. 16B is a block diagram illustrating an information processing system including a semiconductor memory device according to example embodiments of the inventive concepts.

Referring to FIG. 16A, a memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory device 1210 may include at least one of the semiconductor memory devices 10 to 13, 20 to 23, 30 to 32, and 40 to 42 according to example embodiments of the inventive concept.

Referring to FIG. 16B, an information processing system 1300 may be realized using a memory system 1310 including at least one of the semiconductor memory devices 10 to 13, to 23, 30 to 32, and 40 to 42 according to example embodiments of the inventive concepts. For instance, the information processing system 1300 may be a mobile device and/or a desktop computer. In some embodiments, the information processing system 1300 may further include a modem 1320, a central processing unit (CPU) 1330, a RAM 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system described with respect to FIG. 16A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concepts.

According to example embodiments of the inventive concepts, two memory cells may be formed at different levels by using two metal-layer-forming processes and one contact-plug-forming process, and this enables to reduce the number of fabrication process. In addition, since two metal layers are alternatingly formed in vertical sectional view, it is possible to realize a cell pitch doubling effect (i.e., reducing a pitch of a metal layer by half) without any change in design rules. As a result, without the need of fabrication technology of high cost, such as EUV, it is possible to inexpensively realize memory cells at different levels. This enables to increase the capacity of the memory device and make the memory device cost-competitive with conventional ones. In addition, since the memory cells at each levels have a uniform memory property, it is possible to realize the memory device having high reliability and improved electric characteristics.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor memory device, comprising:
first conductive lines extending along a first direction;
second conductive lines extending along the first direction in parallel with the first conductive lines and disposed vertically higher, with respect to a vertical direction perpendicular to the first direction, than the first conductive lines, such that each of the second conductive lines is offset from a corresponding one of the first conductive lines in a second direction perpendicular to the first direction and the vertical direction such that no gap exists between adjacent first and second conductive lines in the second direction;
a third conductive line extending along the second direction to cross the first and second conductive lines to form intersections therewith and disposed vertically higher than the second conductive lines; and
first single memory cells and second single memory cells formed, respectively, by intersections between the first conductive lines and the third conductive line and by intersections between the second conductive lines and the third conductive line.

2. The semiconductor memory device of claim 1, wherein the first memory cells are formed to have an island shape confined within the corresponding intersections of the first conductive lines and the third conductive line, and the second memory cells are formed to have the island shape confined within the corresponding intersections of the second conductive lines and the third conductive line.

3. The semiconductor memory device of claim 1, further comprising:
first electrodes having a first height to connect the first conductive lines and the third conductive line; and
second electrodes having a second height less than the first height to connect the second conductive lines and the third conductive line.

4. The semiconductor memory device of claim 1, further comprising:
first and second lower electrodes respectively provided along the first and second conductive lines in the first direction;
upper electrodes extending in the second direction along the length of the third conductive line; and
data storing layers extending in the second direction along with the upper electrodes and disposed between the upper electrodes and the first lower electrodes and between the upper electrodes and the second lower electrodes to form the first and second memory cells at the intersections, respectively.

5. The semiconductor memory device of claim 4, wherein the data storing layers include at least one of metal oxide (e.g., TiOx, HfOx, TaOx, NiOx, ZrOx, and WOx), metal nitride (e.g., BNx and AlNx), oxide having Perovskite structure (e.g., PrCaMnO and doped-SrTiO), and solid electrolyte (e.g., GeTe and GeS) containing metal ion (e.g., Cu and Ag) with high diffusivity.

6. The semiconductor memory device of claim 4, wherein the data storing layers are formed of a phase changeable material which is switched from a high resistance (amorphous) state to a low resistance (crystalline) state and back again depending on temperature and a heating time.

7. The semiconductor memory device of claim 4, wherein the data storing layers include at least two ferromagnetic layers.

8. The semiconductor memory device of claim 4, further comprising:
   at least one additional identical semiconductor memory device vertically stacked thereon so that the first and second memory cells are vertically or three-dimensionally disposed therein.

9. The semiconductor memory device of claim 4, wherein the first lower electrodes have an island shape confined within the intersections of the first conductive lines and the third conductive line, and the second lower electrodes have the island shape confined within the intersections of the second conductive lines and the third conductive line.

10. The semiconductor memory device of claim 4, further comprising:
   first selection devices interposed between the first lower electrodes and the data storing layers to control a current flow through the first memory cells; and
   second selection devices interposed between the second lower electrodes and the data storing layers to control a current flow through the second memory cells.

11. The semiconductor memory device of claim 10, wherein each of the first selection devices is shaped like an island confined within the intersections of the first conductive lines and the third conductive line and the second selection devices are shaped like the island confined within the intersections of the second conductive lines and the third conductive line.

12. The semiconductor memory device of claim 10, wherein the first selection devices are disposed on respective ones of the first lower electrodes and both the first lower electrodes and first selection devices have the island shape confined within the intersections of the first conductive lines and the third conductive line, and the second selection devices are disposed on respective ones of the second lower electrodes and both the second lower electrodes and the second selection devices have the island shape confined within the intersections of the second conductive lines and the third conductive line.

13. The semiconductor memory device of claim 10, wherein a pitch between the first selection devices and a pitch between the second selection devices is greater than a width of the first and second conductive lines, respectively.

14. The semiconductor memory device of claim 10, wherein the first and second selection devices are formed to provide diode rectifying properties.

15. The semiconductor memory device of claim 4, wherein a pitch between the first conductive lines is equal to two times a width of each of the first conductive lines, and a pitch between the second conductive lines is equal to two times a width of each of the second conductive lines.

16. The semiconductor memory device of claim 15, wherein the first and second lower electrodes form a Schottky characteristic contact with the data storing layer.

17. The semiconductor memory device of claim 4, wherein the semiconductor memory device further comprises a plurality of third conductive lines, and a pitch between the third conductive lines is equal to two times a width of each of the third conductive lines.

18. The semiconductor memory device of claim 4, wherein contacts between the first lower electrodes and the data storing layer and contacts between the second lower electrodes and the data storing layer have a non-linear characteristic of current flow.

19. The semiconductor memory device of claim 4, wherein a resistance of the data storing layers varies between at least two levels depending on a voltage or electric current applied thereto.

20. A semiconductor memory device, comprising:
   a first conductive line disposed along a first dimension at a first position along a second dimension perpendicular to the first dimension in a vertical direction;
   a second conductive line disposed along the first dimension at a second position along the second dimension and offset from the first conductive line along a third dimension perpendicular to the first dimension in a horizontal direction such that there is no gap between the first and second conductive lines along the third dimension;
   a third conductive line disposed along a third dimension at a third position along the second dimension, the second position being between the first position and the third position;
   a first memory cell provided at a location where the first conductive line crosses the third conductive line; and
   a second memory cell provided at a location where the second conductive line crosses the third conductive line,
   wherein the first dimension is perpendicular to each of the second dimension and the third dimension and the second dimension is perpendicular to the third dimension.

21. A semiconductor memory device, comprising:
   a first conductive line having a length longer than a width, the length extending along a first direction;
   a second conductive line having a length longer than a width, the length extending along the first direction parallel to the first conductive line, the widths of the first and second conductive lines extending in a second direction perpendicular to the first direction, the second conductive line being offset from the first conductive line in a third direction perpendicular to the first direction and the second direction, such that a plane parallel to the first direction and the third direction contacts each of the first conductive line and the second conductive line; and
   a third conductive line having a length longer than a width, the length extending along the second direction, a plane parallel to the second direction and the third direction passing through the third conductive line also passes through each of the first and second conductive lines, the third conductive line including a first memory cell at an electrical junction of the first conductive line and the third conductive line and including a second memory cell at an electrical junction of the second conductive line and the third conductive line.

* * * * *